(12) United States Patent
Oshima

(10) Patent No.: US 6,376,386 B1
(45) Date of Patent: *Apr. 23, 2002

(54) METHOD OF ETCHING SILICON NITRIDE BY A MIXTURE OF $CH_2F_2$, $CH_3F$ OR $CHF_3$ AND AN INERT GAS

(75) Inventor: Tadashi Oshima, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,018
(22) Filed: Feb. 25, 1998
(30) Foreign Application Priority Data Feb. 25, 1997 (JP) .............................................. 9-040963

(51) Int. Cl.[7] ...................... H01L 21/302; H01L 21/461
(52) U.S. Cl. ........................ 438/714; 438/715; 438/724
(58) Field of Search ................................ 438/715, 706, 438/724, 711, 719, 727, 714

(56) References Cited

U.S. PATENT DOCUMENTS

| | | | |
|---|---|---|---|
| 4,844,773 A | * | 7/1989 | Loewenstein et al. ...... 156/643 |
| 5,002,632 A | * | 3/1991 | Loewenstein et al. ...... 156/643 |

FOREIGN PATENT DOCUMENTS

| | | |
|---|---|---|
| DE | 4232475 | 3/1994 |
| JP | 59-222933 | 12/1984 |
| JP | 61-142744 | 6/1986 |
| JP | 62-696622 | 3/1987 |
| JP | 62-102530 | 5/1987 |
| JP | 62-163328 | 7/1987 |
| JP | 2-240927 | 9/1990 |
| JP | 6-77175 | 3/1994 |

OTHER PUBLICATIONS

Office Action from Korean Patent Office, Patent Appln. No. 10-1988-0005931, dated Jul. 24, 2000 (English only).

Y. Kawamoto et al., 59-222933, Japan, Etching Method Kokai Dec. 14, 1984 English Abstract Only.

S. Kadomura, 61-142744, Japan, Etching Gas and Etching Method Using Said Gas Kokai Jun. 30, 1986 English Abstract Only.

Kadomura, 62-69622, Japan, Etching of Nitride Film Kokai Mar. 30, 1987 English Abstract Only.

I. Nakayama et al., 62-163328, Japan, Dry Etching Method Kokai Jul. 20, 1987 English Abstract Only.

W. Kamisaka, 2-240927, Japan, Manufacture of Insulating Film for Isolation of Element in Semiconductor Device Kokai Sep. 25, 1990 English Abstract Only.

S. Kadomura, 6-77175, Japan, Etching Method of Silicon Nitride on Silicon Oxide Kokai Mar. 18, 1994 English Abstract Only.

* cited by examiner

*Primary Examiner*—Olik Chaudhuri
*Assistant Examiner*—Shrinivas H. Rao
(74) *Attorney, Agent, or Firm*—Armstrong, Westerman & Hattori, LLP

(57) ABSTRACT

There are included steps of forming a silicon nitride layer on a silicon layer or a silicon oxide layer, loading the silicon layer or the silicon oxide layer and the silicon nitride layer in a dry etching atmosphere, and selectively etching the silicon nitride layer with respect to the silicon layer or the silicon oxide layer by flowing a fluorine gas consisting of any one of $CH_2F_2$, $CH_3F$, or $CHF_3$ and an inert gas to the dry etching atmosphere. Hence, in the etching process of the silicon nitride layer, the etching selectivity of the silicon nitride layer to Si or $SiO_2$ can be enhanced and also etching anisotropy can be enhanced.

10 Claims, 21 Drawing Sheets

FIG.16C  IMPURITY ION IMPLANTATION

METHOD OF ETCHING SILICON NITRIDE BY A MIXTURE OF $CH_2F_2$, $CH_3F$ OR $CHF_3$ AND AN INERT GAS

BACKGROUND OF THE INVENTION

1. Field of the Invention

The present invention relates to a method of etching a silicon nitride layer and a method of manufacturing a semiconductor device including a step of patterning the silicon nitride layer.

2. Description of the Prior Art

With the development of miniaturization of the semiconductor integrated circuit (LSI), a SAC (Self Alignment Contact) technique and a BLC (Border Less Contact) technique have been employed to arrange the wirings from an impurity diffusion layer to a field insulating film.

According to the SAC technique, in the event that wirings are connected to two MOS transistors which employ one impurity diffusion layer as a common constituent element and the wirings are to be connected to a common impurity diffusion layer between two gate electrodes, connecting positions of the wirings are regulated by an insulating layer formed on surfaces of two gate electrodes.

Like the above, with the use of the SAC technique, the wirings can be easily and firmly connected to the impurity diffusion layer between the gate electrodes which are narrowed together with the miniaturization.

According to the BLC technique, grooves are formed in a device isolation region of a semiconductor substrate, then silicon oxide is filled in the grooves, then an impurity diffusion layer is formed on a semiconductor substrate, then wirings are formed in a region spreading from the impurity diffusion layer to the device isolation region.

If such BLC technique is employed, an alignment margin in the contact area between the wiring and the impurity diffusion layer can be increased.

Next, examples of the semiconductor device employing the SAC technique and the BLC technique in the prior art will be explained hereunder.

SAC technique

As shown in FIG. 17A, a gate electrode 103 is formed on a silicon substrate 100 via a gate insulating layer 102 and then a cap layer 104 made of $SiO_2$ is formed on the gate electrode 103. Side walls 105 made of $SiO_2$ are formed on the side surfaces of the gate electrode 103. Impurity diffusion layers 101 on the silicon substrate 100 are formed by a first ion implantation with low concentration after the gate electrodes 103 have been formed and a second ion implantation with high concentration after the side walls 105 are formed to have an LDD (Lightly Doped Drain) structure.

In such condition, after a thin protection film 106 made of $SiO_2$ is formed on an overall surface, a covering layer 107 made of $Si_3N_4$ is formed and then an interlayer insulating layer 108 made of BPSG and an intermediate layer 109 made of $SiO_2$ are formed on the covering layer 107.

Subsequently, in order to form contact holes in the interlayer insulating layer 108 and the intermediate layer 109, a photoresist 110 having windows 111 over gaps between the side walls 105 is formed.

In turn, as shown in FIG. 17B, contact holes 112 are formed by dry-etching the interlayer insulating layer 108 via the windows 111 of the photoresist 110 in the vertical direction. In this case, the covering layer 107 made of $Si_3N_4$ having a small etching rate may be used as an etchant to etch the interlayer insulating layer 108 and the intermediate layer 109. Hence, the cap layer 104 and the side walls 105 still remain beneath the covering layer 107 because the covering layer 107 serves as an etching stopper.

Next, as shown in FIG. 17C, the covering layer 107 and the protection film 106 formed beneath the contact holes 112 are removed by etching. Thus, the impurity diffusion layers 101 are formed on the side surfaces of the side walls 105 are exposed. As the method of etching the covering layer 107 made of $Si_3N_4$, reactive ion etching using the fluorine gas can be employed. In addition, etching of the protection film 106 made of $SiO_2$ is executed by use of dilution hydrogen fluoride.

After the photoresist 110 has been removed, wirings are formed on the interlayer insulating layer 108, though not particularly depicted, and then the wirings are connected to the impurity diffusion layers 101 via clearances between the contact holes 112 and clearances between the side walls 105.

BLC technique

First, steps of forming up to a structure shown in FIG. 18A will be explained.

A groove 112 is formed is formed in the device isolation region of the silicon substrate 121, and then a buried insulating film 123 made of silicon oxide is filled into the groove 122. As a method of filling the buried insulating film 123 into the groove 122, such a method can be employed, for example, that the buried insulating film 123 is formed by CVD (Chemical Vapor Deposition) in the groove 122 and on the silicon substrate 121 and then the buried insulating film 123 on a surface of the silicon substrate 121 is removed by polishing.

A gate insulating film 124, a gate electrode 125, and a gate covering insulating film 126 are then formed in an active region. Then, low-impurity concentration regions 127a, 127d are formed by ion-implanting the impurity into the silicon substrate 121 on both sides of the gate electrode 125 at a low dosage by use of the gate electrode 125 as a mask.

Then, an insulating film 128 made of silicon nitride and silicon nitride oxide is formed on the silicon substrate 121, the gate covering insulating film 126, and the low-impurity concentration regions 127a, 127d.

Thereafter, as shown in FIG. 18B, the insulating film 128 is etched in the substantially vertical direction by RIE (Reactive Ion Etching) such that the insulating film 128 remains on side surfaces of the gate electrode 125 and the gate covering insulating film 126. Such insulating films 128 remaining on the side surfaces of the gate electrode 125 are called side walls.

Then, as shown in FIG. 18C, using the side walls 128 and the gate covering insulating film 126 as a mask, impurity is ion-implanted at a high dosage into the active region which is not covered with the gate electrode 125 and the side walls 128. Therefore, high-impurity concentration regions 129a, 129d are formed in the active region.

The LDD structure impurity diffusion layers 129a, 129d can be formed on both sides of the gate electrode 125 by the high-impurity concentration regions 129s, 129d and the low-impurity concentration regions 127a, 127d.

As shown in FIG. 18D, silicide layers 131s, 131d are formed on surfaces of the low-impurity concentration regions 127s, 127d by the salicide (self-align silicide) technique.

Thus, a MOS transistor can be formed in the active region.

After this, as shown in FIG. 18E, a silicon nitride film 132 is formed in the active region and the device isolation region, and then an interlayer insulating film 133 made of silicon oxide is formed on the silicon nitride film 132.

Then, a plurality of contact holes 134a, 134d are formed in the silicon nitride film 132 and the interlayer insulating film 133 by the photolithography technique. These contact holes 134s, 134d are formed on two silicide layers 131s, 131d in the active region. In this case, if miniaturization of the semiconductor device is considered, a diameter of the contact holes 134s, 134d cannot be formed to have a wide margin in size rather than the high-impurity concentration regions 129s, 129d and as a result the contact holes 134s, 134d can be formed to cross over the buried insulating film 123.

Then, the wirings (not shown) are provided to the LDD structure impurity diffusion layers 129s, 129d via the contact holes 124s, 134d.

With the above, the common SAC technique and the common BCL technique have been described.

Meanwhile, for example, as set forth in Patent Application Publication (KOKAI) 6-12765, it has been deduced that an etching rate of $Si_3N_4$ can be enhanced rather than that of Si if one of $CH_2F_2$ and $CH_3F$ is employed as an etching gas to etch a covering layer made of silicon nitride, and that the etching rate of $Si_3N_4$ can be enhanced up to about ten times those of $SiO_2$ and Si if the flow rate of the gas is changed and the pressure is set higher.

In general, if $Si_3N_4$ is etched by use of a gas mixture which consists of a fluorine compound gas as a major gas such as $CF_4$, $SF_6$, or $NF_3$, oxygen, etc., following etching performance has been derived.

Si etching rate>$Si_3N_4$ etching rate>$SiO_2$ etching rate

In this case, a value $\alpha/\beta$ obtained by dividing the etching rate $\alpha$ of $Si_3N_4$ by the etching rate $\beta$ of $SiO_2$ (referred to as an "etching selectivity of $Si_3N_4$ to $SiO_2$" hereinafter) has been 2 to 3. Therefore, such gas mixture can be used for the SAC and the BLC, but such gas mixture enables only isotropic etching. Besides, damage of the silicon substrate is increased under such $SiN_x$ etching condition.

According to the inventors' experiment using another etching gas which includes $CF_4$ and $CHF_3$ mainly, following etching performance has been derived.

$SiO_2$ etching rate>$Si_3N_4$ etching rate>Si etching rate

In this case, the etching selectivity of $Si_3N_4$ to $SiO_2$ has been in the range of 0.5 to 1 and such another etching gas enables anisotropic etching. Such another etching gas can be used for information of the contact hole and removal of the LOCOS nitride film.

Meanwhile, followings have arisen as problems in the SAC technique.

If the fluorine gas is used as the etching gas, the etching selectivity of $Si_3N_4$ to $SiO_2$ or Si has been enhanced, but such fluorine gas has enabled only isotropic etching. Hence, a patterning accuracy of the silicon nitride layer has been degraded.

For instance, as shown in FIG. 17A, if etching isotropy is enhanced on the etching step of the covering layer 107, the covering layer 107 is side-etched and further extended from the contact hole 112 laterally. As a result, recesses are formed between the cap layer 104 and the interlayer insulating layer 108 along the lateral direction. If such lateral recesses are considerably deep, i.e., an amount of the side etching becomes large, the covering layer 107 has been eliminated over the gate electrodes 103 so that the lateral holes are formed. Such lateral holes would cause short-circuit of two wirings passing through the neighboring contact holes 112.

On the contrary, it may be considered that an etching time can be shortened in order to prevent the side etching of the covering layer 107. However, in this case, because of insufficient etching, the covering layer 107 has remained on the side surfaces of the side walls 105. Thus, respective areas of the impurity diffusion layers 101 which are exposed on the side of the side walls 105 are made small. Under such condition, a contact resistance between the wiring passing through the contact hole 112 and the impurity diffusion layer 101 is likely to be increased.

In addition, in order to completely remove the covering layer 107 on the side surfaces of the side walls 105, it may also be considered that the etching selectivity of $Si_3N_4$ to $SiO_2$ can be made small to thus enhance anisotropy. In this case, there has been caused such a disadvantage that side surfaces of the $SiO_2$ cap layer 104 covering the gate electrode 103 is etched and thus short-circuit between the wiring formed in the contact hole 112 and the gate electrode 103 would be caused.

Further, if overetching is carried out to remove completely the covering layer 107 between two gate electrodes 103, upper edges of the side walls 105 are also removed so that a part of the gate electrode 103 is exposed. As a result, the gate electrode 103 is short-circuited to a plug passing through the contact hole 112.

While, followings have arisen as problems in the BLC technique.

For example, if the etching selectivity of the silicon nitride to the silicon oxide cannot be enhanced when the silicon nitride film 132 is etched via the contact holes 134s, 134d formed in the interlayer insulating film 133, a surface of the buried insulating film 123 made of silicon oxide is etched to thus expose a part of the silicon substrate 121, as shown in FIG. 19. Therefore, since a metal plug formed in the contact holes 134s, 134d is also connected to the silicon substrate 121, the silicon substrate 121 and the metal plug are short-circuited so that a leakage current flows via such short-circuited portion.

The side wall 128 has been formed of silicon oxide in the above explanation. However, if the side wall 128 is formed of silicon nitride, the etching selectivity of the silicon nitride to the silicon substrate must be enhanced. More particularly, as shown on the left side in FIG. 20, the event that the low-impurity concentration regions 127s, 127d are etched upon vertical etching of the silicon nitride signifies that the low-impurity concentration regions 127s, 127d beneath the silicide layer 134s are made shallower and therefore resistances of the low-impurity concentration regions 127s, 127d are increased. In addition, as shown on the right side in FIG. 20, if an etching depth on the surface of the silicon substrate 121 is increased upon etching of the silicon nitride constituting the side wall 128a, a depletion layer extended from the impurity diffusion layer 130d cannot be stabilized, but also the silicide layer 134s protrudes from the low-impurity concentration regions 127s. As a result, a leakage current becomes easy to flow into the silicon substrate 121.

As described above, in the above prior art, there has been such a problem that the etching selectivity of the silicon nitride to the silicon oxide and the anisotropy have trade-off relations with each other.

SUMMARY OF THE INVENTION

It is an object of the present invention to provide a method of etching a silicon nitride layer which is capable of enhancing an etching selectivity of silicon nitride to silicon and silicon oxide and enhancing etching anisotropy of the silicon nitride, and a method of manufacturing a semiconductor device including such etching step.

The method of etching a silicon nitride layer comprising the steps of forming a silicon nitride layer on a silicon layer or a silicon oxide layer; loading the silicon layer or the silicon oxide layer and the silicon nitride layer in a dry etching atmosphere; and selectively etching the silicon nitride layer with respect to the silicon layer or the silicon oxide layer by flowing a fluorine compound gas consisting of any one of $CH_2F_2$, $CH_3F$, and $CHF_3$ and an inert gas to the dry etching atmosphere.

According to the present invention, the silicon nitride layer is dry-etched by using the fluorine compound gas composed of any one of $CH_2F_2$, $CH_3$, and $CHF_3$ and the inert gas such as Ar, He, etc. With the use of these gases, the etching rate of the silicon nitride layer can be enhanced ten times or more the etching rate of the silicon oxide layer or the silicon layer beneath the silicon nitride layer and in addition the anisotropic etching thereof can be achieved.

That is to say, the etching selectivity of the silicon nitride layer to the silicon oxide layer and the silicon layer can be enhanced and simultaneously side etching upon patterning of the silicon nitride layer can be suppressed.

Such etching performance can remarkably appear when the flow rate of the inert gas is set more than three times the flow rate of the fluorine compound gas, in a ratio between the fluorine compound gas introduced into the chamber and the inert gas.

Hence, in the step of forming the semiconductor device employing the SAC technique, because such etching process is employed, the silicon nitride layer can be excessively etched not to remain the silicon nitride on the side surfaces of the side walls of the gate electrodes. In addition, the silicon oxide layer covering the gate electrodes is never removed by etching. As a result, the contact region formed between two side walls can be prevented from being narrowed and also short-circuit between the gate electrodes and conductive layers in the contact holes can be prevented.

Also, in the step of forming the semiconductor device employing the BLC technique, if the etching method is applied under the above conditions, etching of the silicon oxide layer which is buried in the groove in the neighboring of the device forming region can be suppressed and the silicon substrate is difficult to be exposed from the side walls of the groove. Consequently, the electrodes formed to cross over the boarder between the groove and the silicon substrate can be avoided from being connected to the silicon substrate beneath the impurity diffusion layer.

Furthermore, the impurity diffusion layer becomes difficult to be etched by virtue of the RIE which is used to form the side wall made of silicon nitride or silicon nitride oxide on both sides of the gate electrode of the MOS transistor, so that the increase of the leakage current and the increase of electric resistance due to the thinned impurity diffusion layer can be avoided.

In order to carry out the patterning of the silicon nitride layer as an oxidation preventing mask upon selective oxidation of the silicon substrate, the etching selectivity of the silicon nitride layer to the silicon substrate or the silicon oxide layer formed thereunder can be improved even if the silicon nitride layer is etched under the above conditions. As a result, crystal defects in the silicon substrate due to the etching of the silicon nitride layer can be prevented and also contamination of the silicon oxide layer can be prevented.

Other and further objects and features of the present invention will become obvious in an understanding of the embodiments about to be described in connection with the accompanying drawings or will be indicated in the appended claims.

BRIEF DESCRIPTION OF THE DRAWINGS

FIGS. 16A to 16J are sectional views showing steps of manufacturing a semiconductor device with the use of BLC technique in the embodiment of the present invention;

DESCRIPTION OF THE PREFERRED EMBODIMENTS

Figure 1:
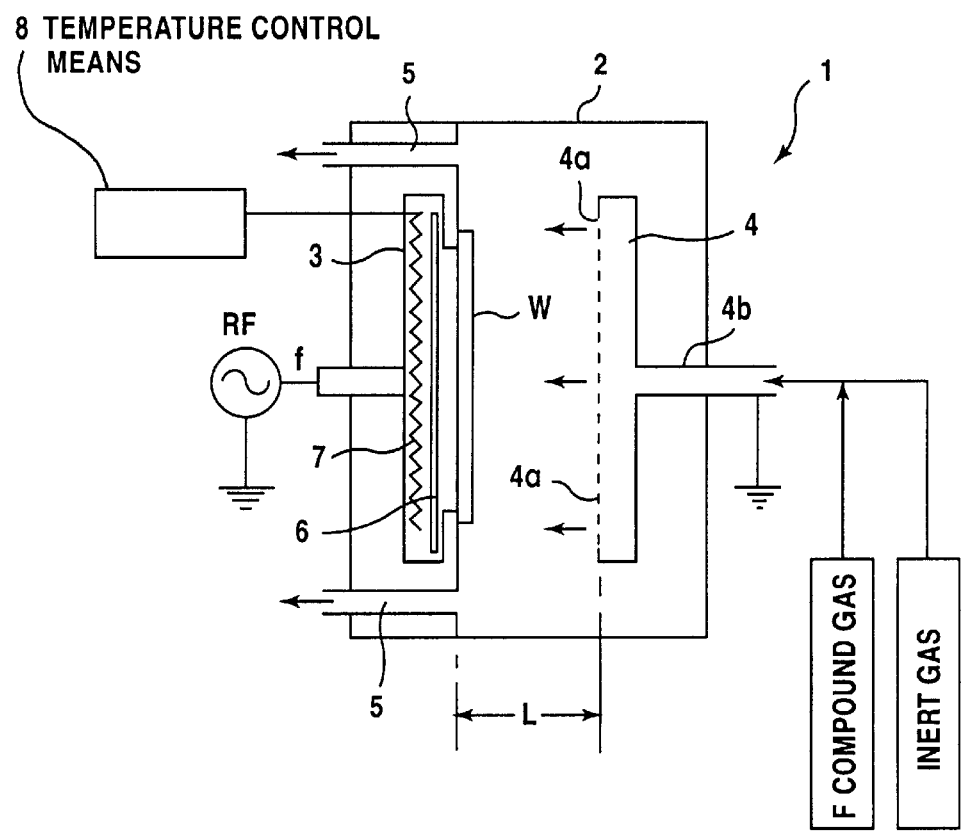
FIG. 1 is a schematic view showing a configuration of an example of an etching equipment used for etching of an insulating film in the present invention.

Embodiments of the present invention will be explained in detail with reference to the accompanying drawings hereinafter. It should be noted that the same or similar reference numerals are applied to the same or similar parts and elements throughout the drawings and the explanation of the same or similar parts or elements will be omitted or simplified.

FIG. 1 is a schematic view showing a configuration of a reactive ion etching (RIE) equipment used for etching a silicon nitride layer in the present invention.

An electrode 3 on which a wafer (substrate) W is loaded and a gas shower 4 which opposes to the electrode 3 at a distance L are arranged in a quartz chamber 2 of the RIE equipment 1. The gas shower 4 has a plurality of gas injecting holes 4a on the side opposing to the electrode 3. A gas pipe 4b is connected to a part of the gas shower 4. The gas shower 4 is made of conductive material such as aluminum, and can function as the other electrode (4).

A radio frequency power supply RF of a frequency f is connected to the electrode 3, while an earth wire is connected to the gas shower 4.

In FIG. 1, a reference 5 denotes an exhausting pipe; 6, a template; 7, a heating means; and 8, a temperature controlling means.

It has been found by the inventors of the present invention that, if an interior of the chamber 2 of the RIE equipment 1 is reduced in pressure, then a fluorine compound gas such as $CH_2F_2$, $CH_3F$, or $CHF_3$ and an inert gas such as Ar, He, etc. are introduced into the chamber 2, and then a silicon nitride ($Si_3N_4$) film, a silicon oxide ($SiO_2$) film, and a silicon (Si) layer on the wafer W are etched with the use of products obtained by plasmanizing these gases, vertical anisotropic etching of $Si_3N_4$ is made possible under the situation that the etching selectivity of $Si_3N_4$ to $SiO_2$ or Si is enhanced.

Therefore, results of etching of $Si_3N_4$, $SiO_2$, and Si by introducing $CH_2F_2$ as the fluorine compound gas and the argon (Ar) gas as the inert gas into the chamber 2 will be explained hereunder. A six-inch silicon wafer has been used as the wafer W herein.

For examination of etching, experiments have been carried out by changing conditions of the distance L between the electrodes and the power supply frequency f of the RIE equipment. The case where the distance L between the electrodes and the power supply frequency f are selected as 70 mm and 13.56 MHZ respectively is set as the first equipment constituting condition, and the case where the distance L between the electrodes and the power supply frequency f are selected as 10 mm and 400 kHz respectively is set as the second equipment constituting condition.

(First Equipment Constituting Condition)

Figure 2:
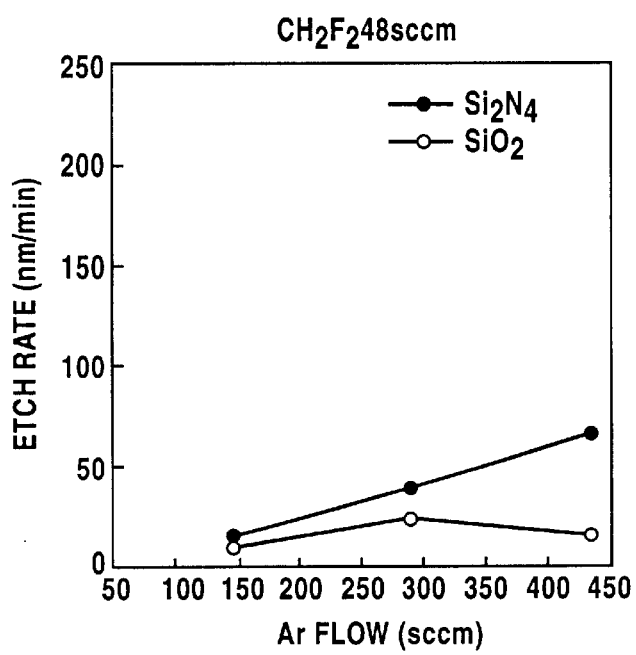
FIG. 2 is a graph showing an experimental result illustrative of etching conditions of the present invention, i.e., a relationship between an etching rate and an Ar flow rate for the silicon nitride layer and a silicon oxide layer if a $CH_2F_2$ and an Ar gas is employed.

FIG. 2 showing the results of a relationship between an etching rate and an Ar gas flow rate examined under the condition that $CH_2F_2$ gas is supplied to the chamber 2 at a flow rate of 48 sccm. In this experiment, power of the power supply RF is 400 W, and a pressure in the chamber 2 is 100 mTorr. According to this experimental results, as the flow rate of Ar gas is increased, an etching rate of the $Si_3N_4$ film has been enhanced, but an etching rate of the $SiO_2$ film has been hardly changed.

Hence, in order to enhance the etching selectivity of the $Si_3N_4$ film to the $SiO_2$ film, it has been evident that it is effective that the argon gas must be introduced and its flow rate must be controlled.

Figure 3:
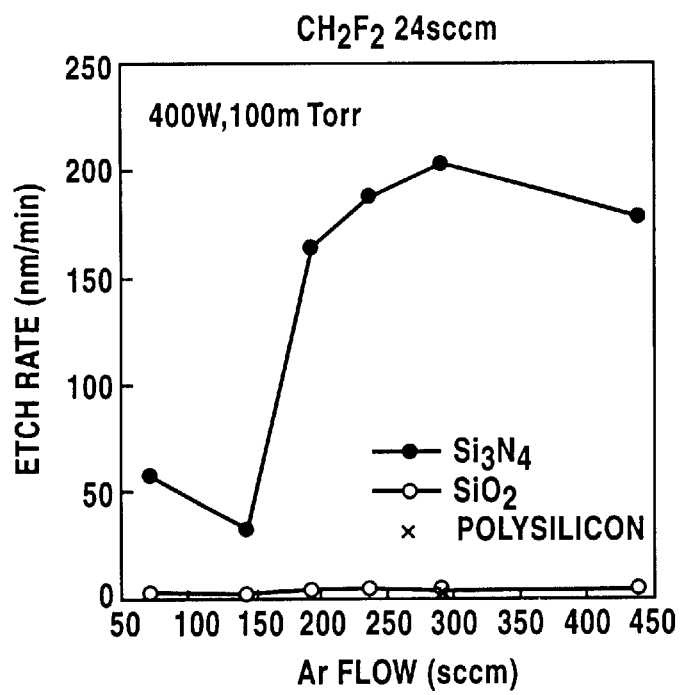
FIG. 3 is a graph showing an experimental result illustrative of etching conditions of the present invention, i.e., a relationship between an etching rate and an Ar flow rate for the silicon nitride layer and the silicon oxide layer under the condition that a flow rate of the $CH_2F_2$ is reduced to half of the experiment shown in FIG. 2.

FIG. 3 showing the results of a relationship between an etching rate and an Ar gas flow rate examined under the condition that a flow rate of the $CH_2F_2$ is set to 24 sccm. In this experiment, power of the power supply RF is 400 W, and a pressure in the chamber 2 is 100 mTorr. According to characteristic curves of this experiment, it would be understood that the etching selectivity becomes large rather than the case shown in FIG. 2.

What is derived from the characteristic curves in FIGS. 2 and 3 is that the etching selectivity of the $Si_3N_4$ film can be enhanced by increasing the flow rate of Ar gas rather than the flow rate of $CH_2F_2$ gas. Particularly, as shown in FIG. 3, such tendency appears remarkably in the event that the flow rate of $CH_2F_2$ gas is reduced. The etching selectivity exceeds 10 if the flow rate of Ar gas is set three times the flow rate of $CH_2F_2$ gas whereas the etching selectivity becomes about 30 if the flow rate of Ar gas is set eight times the flow rate of $CH_2F_2$ gas. The etching rate of the silicon is 3 nm/min, when the Art flow is set for 290 sccm.

Figure 4:
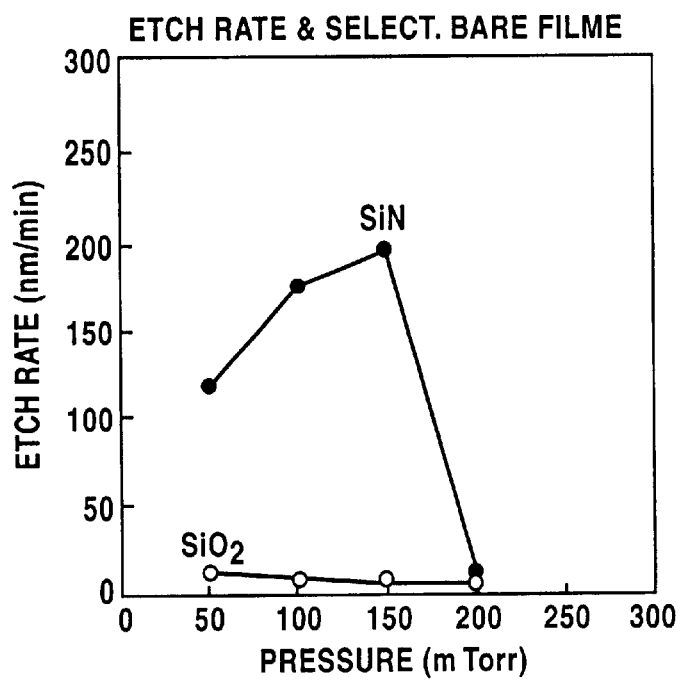
FIG. 4 is a graph showing an experimental result illustrative of etching conditions of the present invention, i.e., a relationship between an etching rate and an etching atmospheric pressure if the silicon nitride layer and the silicon oxide layer are separately etched.

When a relationship between an etching rate and a pressure in the chamber 2 has been examined, the results shown in FIG. 4 has been derived. It has been found that the etching selectivity of the $Si_3N_4$ film can be further enhanced as the pressure is made higher until the pressure comes up to 150 mTorr, but the etching selectivity of the $Si_3N_4$ film is reduced when the pressure exceeds 150 mTorr. As the reason for reduction in the etching selectivity of the $Si_3N_4$ film, it may be considered that a film growth component on the surface of the wafer W is increased when the pressure becomes higher.

In the experiment shown in FIG. 4, the flow rate of $CH_2F_2$ gas is set to 24 sccm, the flow rate of Ar gas is set to 290 sccm, and the power of the power supply RF is set to 400 W.

Figure 5:
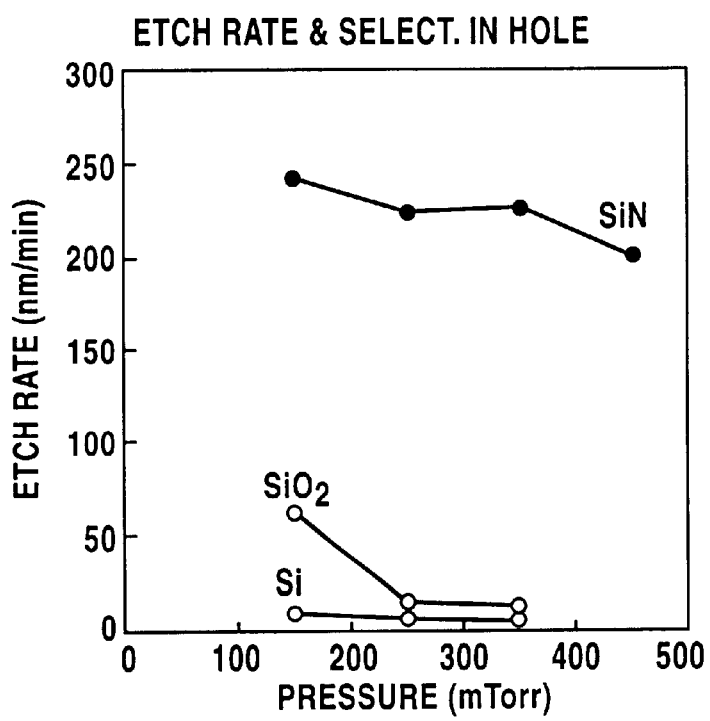
FIG. 5 is a graph showing an experimental result illustrative of etching conditions of the present invention, i.e., a relationship between an etching rate and an etching atmospheric pressure if openings are formed in the silicon nitride layer and the silicon oxide layer.
Figure 7:
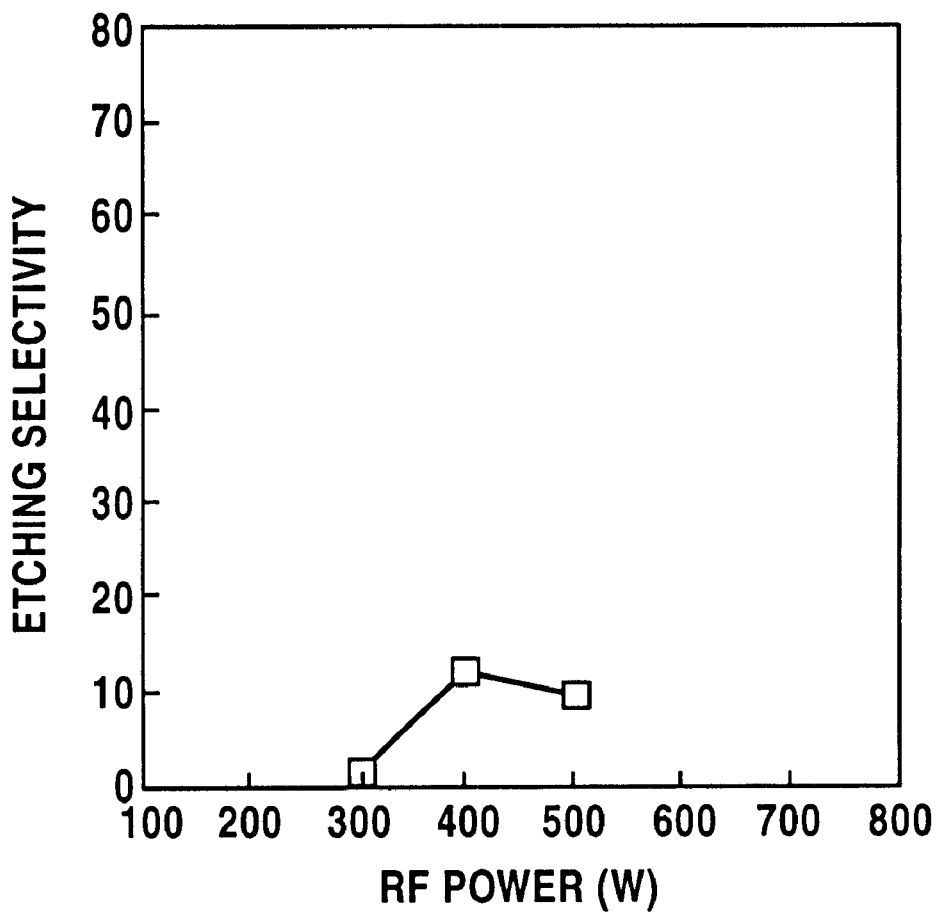
FIG. 7 is a graph showing an experimental result illustrative of etching conditions of the present invention, i.e., a relationship between an etching selectivity and a supplied power of an RF power supply in the silicon nitride layer and those in the silicon oxide layer.

FIG. 4 shows experimental results when the $SiO_2$ film, the Si film, and the $Si_3N_4$ film are etched. Therefore, the results as shown in FIG. 5 can be derived when it has been examined how the etching selectivity of the $Si_3N_4$ film to $SiO_2$ or Si is changed in the contact hole. As shown in FIG. 7, the etching is carried out with respect to the $Si_3N_4$ film, the $SiO_2$ film, and the Si substrate which are located beneath the contact hole opened to have an aspect ratio of about 2.

According to FIG. 5, the etching rate of the $Si_3N_4$ film beneath the contact hole is never decreased abruptly even when the etching atmospheric pressure is made higher than 200 mTorr. An etching amount in excess of 200 nm/min has been obtained at 450 mTorr. While the etching rate of the $SiO_2$ film formed beneath the contact hole is also enhanced, but it can be reduced lower a the pressure becomes higher. The etching rate can be reduced to 20 nm/min at the pressure of more than 250 mTorr, which is less than 1/10 the etching rate of the $Si_3N_4$ film.

With the above explanation, it has been found that the etching selectivity of the $Si_3N_4$ film to the $SiO_2$ film can be controlled arbitrarily by changing the etching atmospheric pressure.

In addition, it has also been found that, when the $Si_3N_4$ film is etched with the use of the $CH_2F_2$ gas and the Ar gas, the etching selectivity of the $Si_3N_4$ film to the $SiO_2$ film or the Si layer can be enhanced and simultaneously the etching rate can be increased as the flow rate of the argon gas is increased.

In this case, even if the etching rate of the $Si_3N_4$ film is increased, i.e., even if the etching selectivity of the $Si_3N_4$ film to the $SiO_2$ film is set to more than 10, the $Si_3N_4$ film beneath the contact hole is seldom side-etched and therefore good patterns have been obtained.

Figure 6:
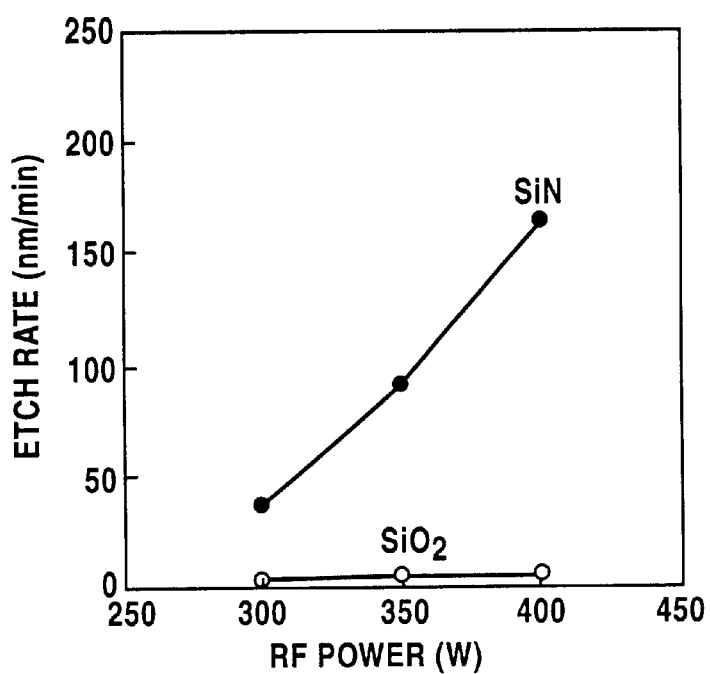
FIG. 6 is a graph showing an experimental result illustrative of etching conditions of the present invention, i.e., a relationship between an etching rate and a magnitude of an RF power for the silicon nitride layer and the silicon oxide layer.

Next, the results shown in FIG. 6 has been obtained when the magnitude of the power supply RF applied to the electrode 3 of the RIE equipment 1 is varied. Particularly, as the power is increased, the etching rate of the $Si_3N_4$ film can be enhanced but the etching rate of the $SiO_2$ film is hardly changed. Hence, it has become obvious that, as the power is increased, the etching selectivity of the $Si_3N_4$ film to the $SiO_2$ film can be enhanced. The etching selectivity corresponding to change in power has been obtained as shown in FIG. 7.

According to further experiment by the inventors of the present invention, it has been found that preferably the flow rate of the fluorine gas is set to 5 to 50 sccm, the flow rate of the inert gas is set three times or more that of the fluorine gas, the etching atmospheric pressure is set to 10 to 500 mTorr, and power applied to the silicon nitride layer is set to 1.1 to 5.5 W/cm$^2$.

Even if another fluorine gas and another inert gas are employed, the same results as the above-mentioned results can be obtained.

(Second Equipment Constituting Condition)

Next, when the distance L between the electrodes and the power supply frequency f are set to 10 mm and 400 kHz respectively, the etching rates and the etching selectivities have been examined. In this case, $CH_2F_2$ and Ar as the gases used in etching are set to 36 sccm and 290 sccm respectively, the pressure in the etching atmosphere is set to 350 mTorr, and the supplied power of the radio frequency power supply is set to 500 W.

Figure 8A:
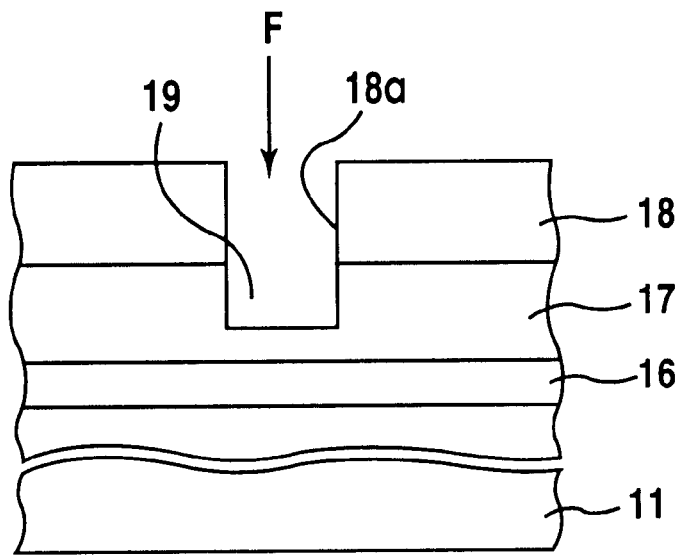
FIGS. 8A and 8B are sectional views showing steps of forming contact holes in the experiment of the present invention respectively.
Figure 8B:
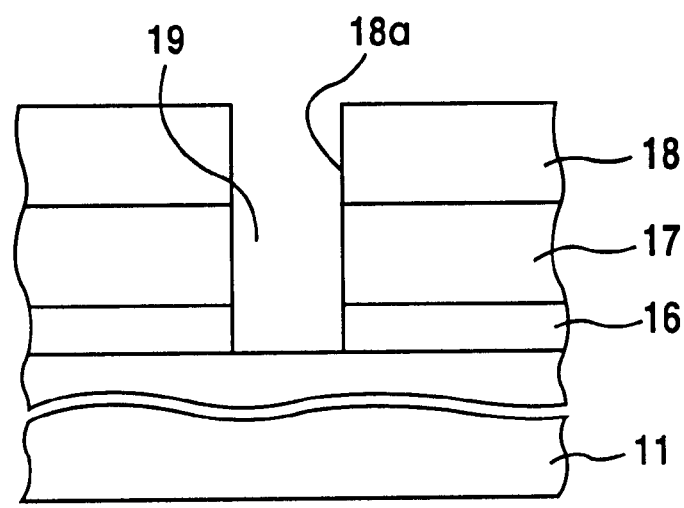

Then, as shown in FIGS. 8A and 8B, the silicon oxide film 16 and the silicon nitride film 17 are formed in order on the silicon substrate 11 and a resist 18 in which a window 18a is opened is formed thereon. In addition, etched states of the silicon nitride film 17 and the silicon oxide film 16 in the middle of forming the contact hole 19 by using the resist 18 as a mask have been examined.

Figure 9:
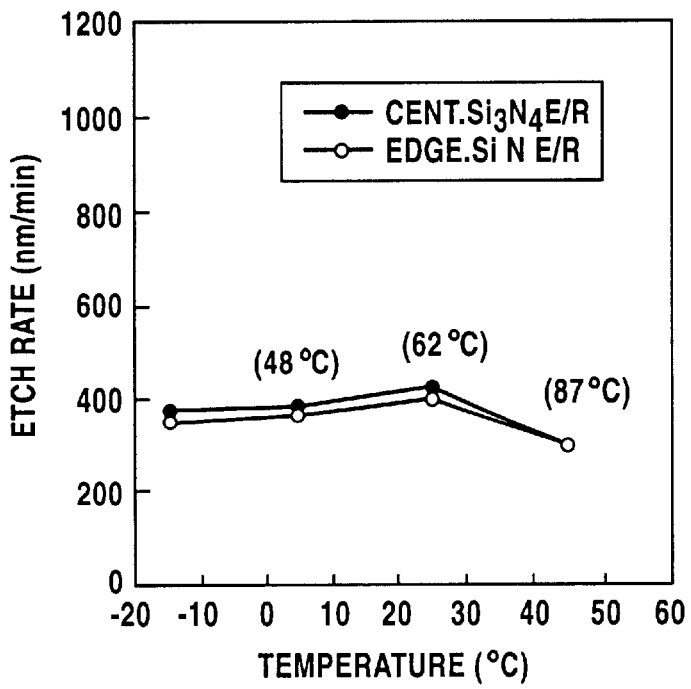
FIG. 9 is a graph showing an experimental result illustrative of etching conditions of the present invention, i.e., a relationship between a substrate heating temperature and an etching rate of the silicon nitride in a substrate central region and a substrate peripheral region formed by the etching of the silicon nitride layer.

FIG. 9 is an experimental result illustrative of a relationship between the wafer heating temperature and the etching rate of the silicon nitride. According to FIG. 9, the etching rate of the silicon nitride is slightly increased as the temperature is increased higher. Further, the result shown in FIG. 10 has been derived by examining the etching selectivity of the silicon nitride to the silicon oxide. The etching selectivity of the silicon nitride is enhanced higher in compliance with an increase in the temperature. However, if the temperature exceeds more than 95° C., etching of the silicon nitride does not proceed and in addition the etching rate becomes zero and it is impossible to measure the etching selectivity. Followings may be guessed as reasons why such results have been derived.

Points 1~3 are possible reasons for the effect of temperature. The sputter ability of ion depends on the Ar flow, the power and the pressure in the atmosphere.
1. The selectivity does not attain the sufficient value when the substrate temperature is set too low, with the effect at the bottom of contact hole 19 being:
   the radical amount of high sticking probability <<the ion sputter etching amount
2. The selectivity attains a sufficient value, when the substrate temperature is set higher than 1), with the effect at the bottom of contact hole 19 being:
   the radical amount of high sticking probability ≧the ion sputter etching amount
3. The $Si_3N_4$ layer is difficult to etch when the substrate temperature is set too high, with the effect at the bottom of contact hole 19 being:
   the radical amount of high sticking probability >>the ion sputter etching amount The area on which the radicals stick depends on the temperature, and the sticking amount depends on the frequency of the radio frequency power supply. The high selective ion assist etching is done by adjusting the radical sticking probability and the ion sputter etching at the bottom of the contact hole to suppress the fluorine radical (F$^*$) production and to hasten the $CF_x^*$ production.

Figure 10:
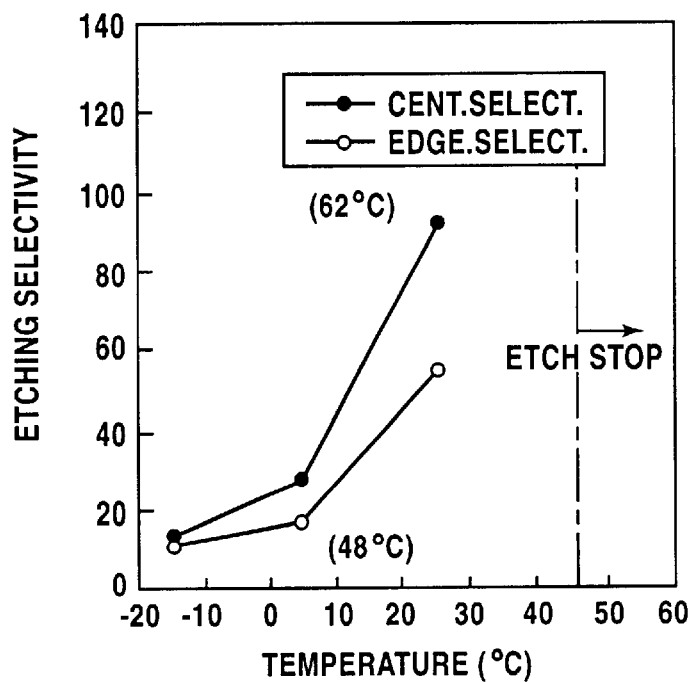
FIG. 10 is a graph showing an experimental result illustrative of etching conditions of the present invention, i.e., a relationship between an etching rate of the silicon nitride layer and the substrate heating temperature in the substrate central region and the substrate peripheral region.

During the experiments to obtain characteristic curves shown in FIGS. 9 and 10, the power of the radio frequency power supply applied between the electrodes 3, 4 of the RIE equipment 1 was kept constant at 500 W. Therefore, a relationship between the power and the etching selectivity will be explained respectively.

Figure 11:
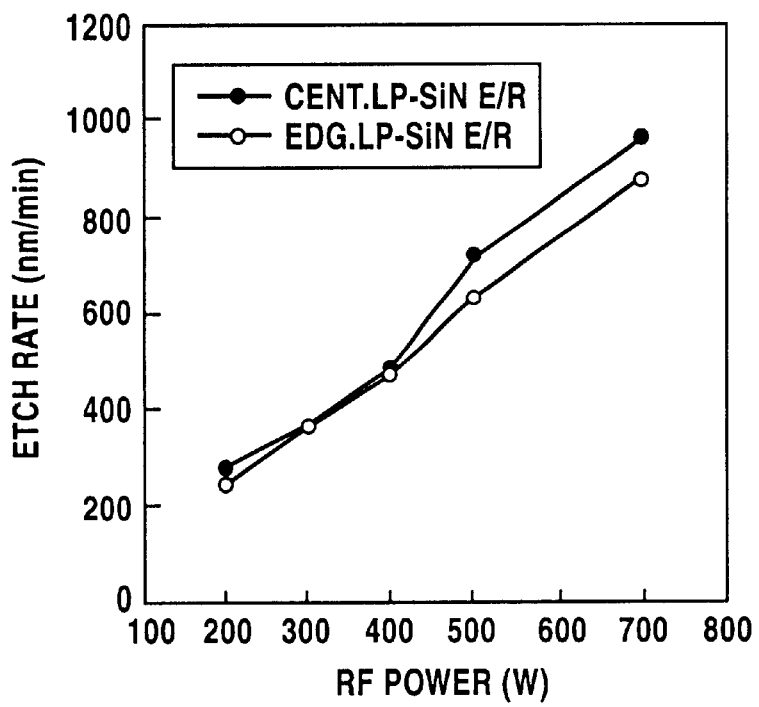
FIG. 11 is a graph showing an experimental result illustrative of etching conditions of the present invention, i.e., a relationship between an etching rate and a magnitude of an RF power for the silicon nitride layer and the silicon oxide layer if a distance between electrodes and a power supply frequency of a reactive ion etching equipment are set lower than those in the experiment shown in FIG. 6.

The result shown in FIG. 11 has been derived by examining how the etching rate of the silicon nitride film depends on the magnitude of the power.

Figure 12:
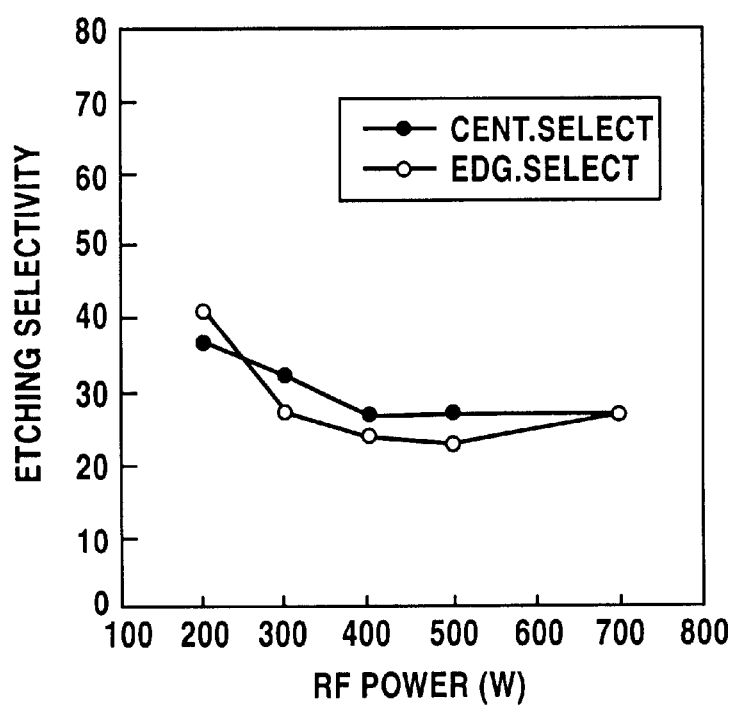
FIG. 12 is a graph showing an experimental result illustrative of etching conditions of the present invention, i.e., a relationship between an etching selectivity and a supplied power of an RF power supply in the silicon nitride layer and those in the silicon oxide layer if the distance between electrodes and the power supply frequency of the reactive ion etching equipment are set lower than those in the experiment shown in FIG. 7.

Next, in order to examine change of the etching rate due to differences in the distance L between the electrodes and the power supply frequency f, the results shown in FIG. 11 and FIG. 6 are compared with each other. Further, in order to examine the etching selectivity due to differences in the distance L between the electrodes and the power supply frequency f, the results shown in FIG. 12 and FIG. 7 are compared with each other. According to such comparison, it has become evident that, if the distance L between the electrodes is smaller or the power supply frequency f is lower, the etching rate and the etching selectivity of the silicon nitride can be increased.

This is because ion in the plasma can be effectively catched by the silicon substrate side by making the distance L between the electrodes smaller or making the power supply frequency f lower, so that the higher etching rate of the silicon nitride can be obtained.

Other than the distance L between the electrodes and the power supply frequency f, the etching conditions to detect the characteristics shown in FIGS. 11 and 12 are set substantially identical entirely.

Figure 16A:
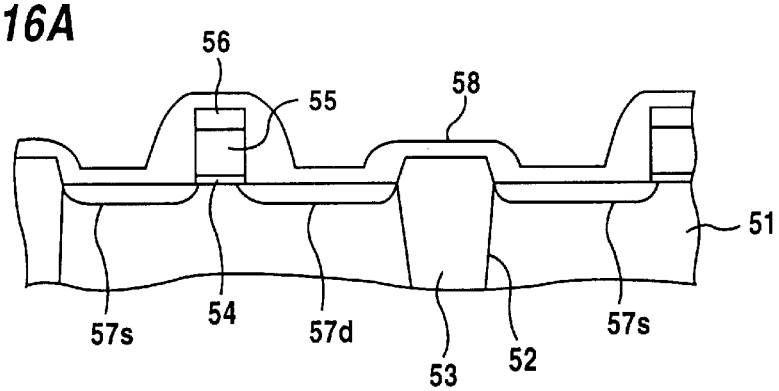
Figure 16B:
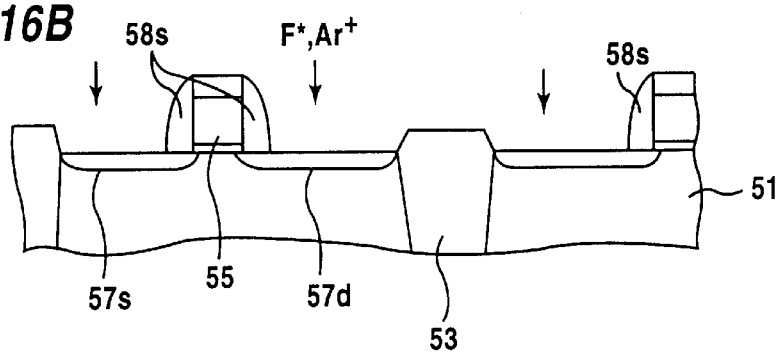
Figure 16B:
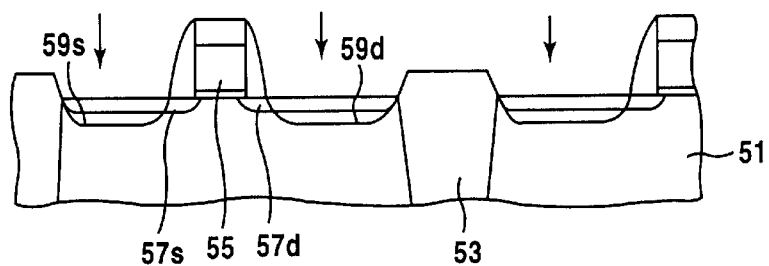

Next, in the SAC technique shown in FIGS. 16B and 16C to be described later, it has been checked by the experiment how the etching of shoulder portions of the side walls 29 made of the silicon oxide advances during formation of the contact holes by etching the silicon nitride film 32, according to differences in the substrate heating temperature and the power of the radio frequency power supply.

Figure 13:
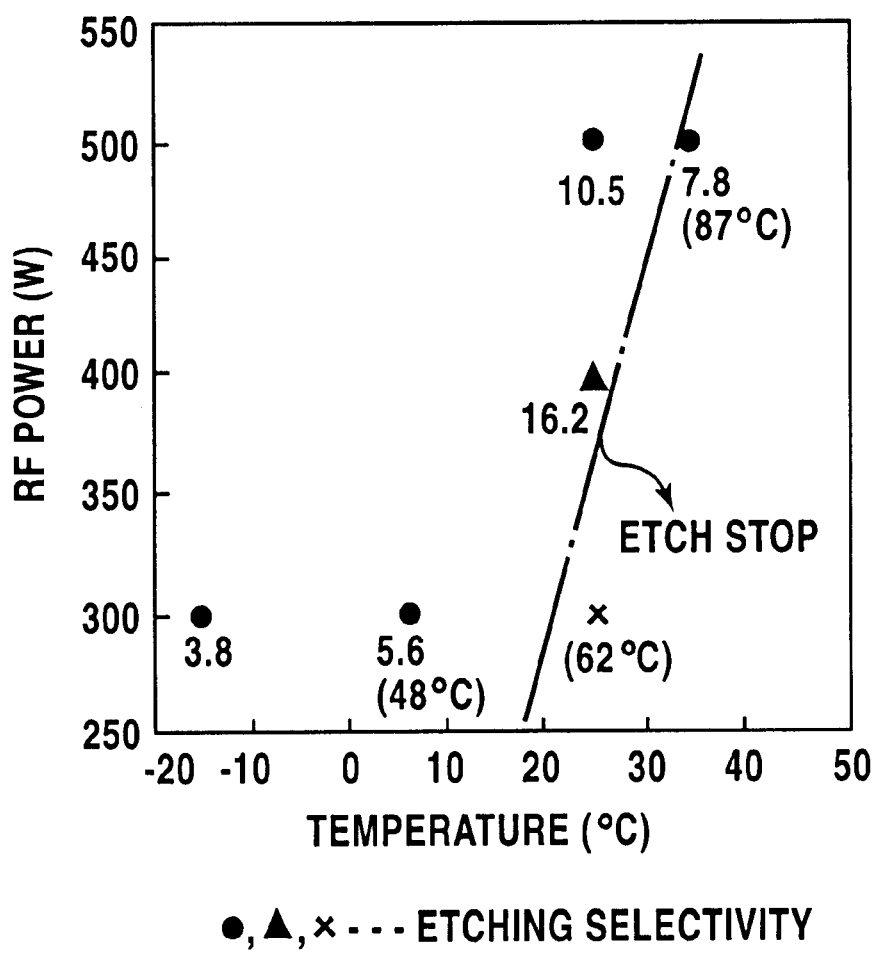
FIG. 13 is a graph showing a distribution of etching selectivity of the silicon nitride in compliance with difference in the supplied power from the RF power supply and the substrate heating temperature.

The etching selectivity near the shoulder of the side walls 29 has appeared as distribution shown in FIG. 13. It has been found that the etching selectivity can be enhanced as the substrate temperature becomes higher and the power of the radio frequency power supply is increased higher. The etching selectivity in the direction 45 degree from the surface can be selected in the range of 10 to 15 by selecting the substrate heating temperature and the power of the radio frequency power supply in such a manner. The etching rate of the silicon nitride film at that etching selectivity ranges from about 400 to 700 mm/min.

In order to enhance the etching selectivity of the silicon nitride film to the silicon oxide film, it is preferable to set the substrate heating temperature to 20 to 95° C. and to set the power of the radio frequency power supply to more than 350 W. The range of these conditions resides in the left side area rather than a dot-dash line in FIG. 13. The etching is difficult to advance in the right side area rather than the dot-dash line in FIG. 13. The reason for this may be guessed that the ions are hard to enter into the contact hole 36 narrowed by the side walls 29 because of high aspect radio of the contact hole 36.

Where the temperature labeled on the abscissas in FIGS. 9, 10, 13 correspond to the set temperature of the template 7 of the RIE equipment. The substrate temperature is affected by the plasma in the chamber 2 as a matter of fact. The temperatures put in parenthenes are values by actual measurement, as shown in FIGS. 9,10 and 13.

In turn, an example of the case where the above technique is applied to manufacture of a semiconductor device will be explained hereunder.

FIRST EXAMPLE

In this first example, there will be explained a step of forming a field oxide film on a silicon substrate by the selective oxidation method using the RIE equipment 1 shown in FIG. 1.

Figure 14A:
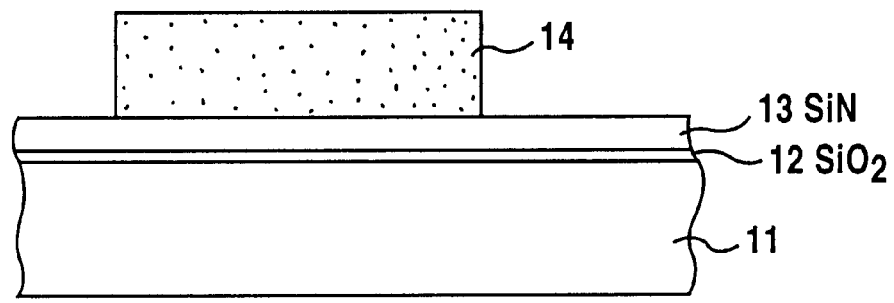
FIGS. 14A to 14C are sectional views showing steps of forming a selective oxidation film on a surface of a semiconductor substrate in the embodiment of the present invention respectively.

First, as shown in FIG. 14A, a thin $SiO_2$ film 12 of 50 Å thickness is formed on a silicon substrate 11, and then an $Si_3N_4$ film 13 is formed on the $SiO_2$ film 12 by CVD. Then, a resist film 14 in which device isolation regions are opened is formed.

Figure 14B:
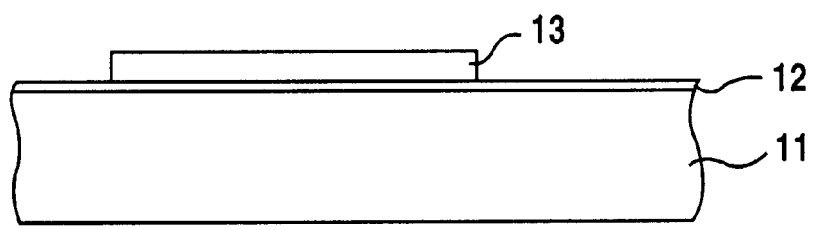

Next, as shown in FIG. 14B, the $Si_3N_4$ film 13 in the range not covered with the resist film 14 is etched. As the etching conditions, according to the experimental results shown in FIG. 4, the pressure in the chamber 2 is set in the range of 50 to 150 mTorr and the etching selectivity is set to more than 10. In addition, the power supplied to the electrode 3 of the RIE equipment 1 is set to 400 W and the flow rate of the $CH_2F_2$ gas is set less than ⅓, preferably ⅕ that of the Ar gas.

Figure 14C:
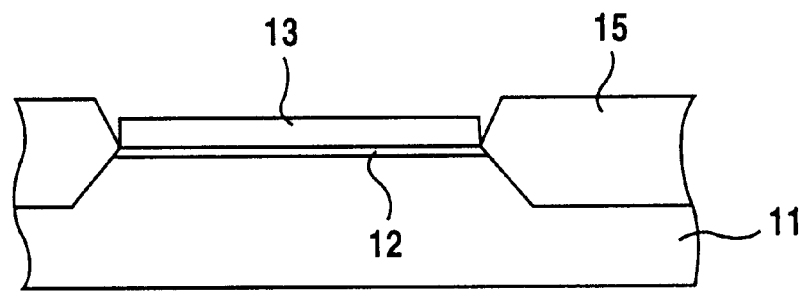

After this, as shown in FIG. 14C, field oxide films 15 made of $SiO_2$ are formed by selectively etching surfaces of the silicon substrate 11 in the range not covered with the $Si_3N_4$ film 13.

If the fluorine gas and the argon gas are employed to pattern the $Si_3N_4$ film for use in selective oxidation as above, the $SiO_2$ film 12 in the device isolation region has not been etched and has still remained though it is thin, so that the surface of the silicon substrate 11 has not been exposed. As a result, the surface of the silicon substrate 11 can be protected by the $SiO_2$ film 12 and therefore contamination and generation of crystal defect upon etching can be prevented.

SECOND EXAMPLE

FIGS. 15A to 15K are sectional views showing steps of manufacturing a DRAM cell to which the above etching technique is applied.

Figure 15A:
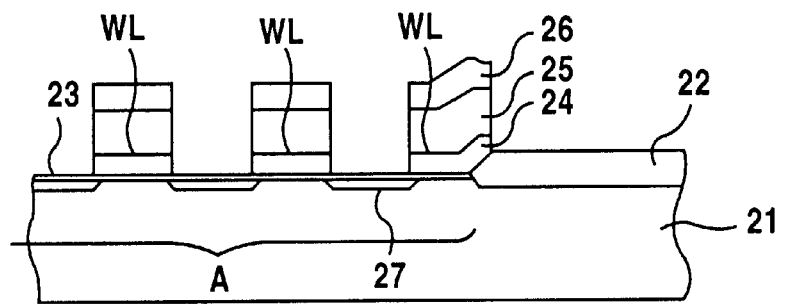
FIGS. 15A to 15K are sectional views showing steps of manufacturing a DRAM cell in the embodiment of the present invention.

First of all, steps of forming a configuration shown in FIG. 15A will be explained.

The field oxide film 22 is formed on the silicon substrate 21 by the selective oxidation method. The field oxide film 22 is formed to surround a device forming region A. Formation of this field oxide film 22 may be carried out according to common conditions, otherwise it may be carried out along the steps being explained in the first example. An about 60 Å thick gate insulating layer 23 made of $SiO_2$ is formed in the device forming region A.

Then, a polysilicon layer 24, a silicide layer 25, and a first cap layer 26 made of $SiO_2$ are formed in sequence on the overall silicon substrate 21 to have thicknesses of 500 Å, 700 Å, and 800 Å respectively. The silicide film 25 is made of tungsten silicide, titanium silicide, etc. and is formed by the salicide technique. The polysilicon layer 24, the silicide layer 25, and the first cap layer 26 are patterned like stripes, as shown in FIG. 15A, by photolitho-graphy using a resist mask (not shown). The polysilicon layer 24 and the silicide layer 25, all being formed like stripes, are used as a word line WL of the DRAM cell. An impurity is introduced into the polysilicon layer 24 upon film formation or after patterning.

These word lines WL are formed to pass through on the gate insulating layer 23 or the field oxide film 22. Portions of the word lines WL passing through on the gate insulating layer 23 may function as the gate electrode of the MOS transistor. The word line WL may be formed to pass through not only on the field oxide film 22 but also boarders between the field oxide film 22 and the device forming region A. In addition, a plurality of word lines WL are arranged at a distance in the device forming region A.

Next, an impurity of one conductivity type is introduced into a surface layer of the silicon substrate 21 using the word lines WL and the field oxide films 22 as a mask to thus form a shallow impurity diffusion layer 27 with low impurity concentration. The impurity has an opposite conductivity type to that being included in the silicon substrate 21.

Figure 15B:
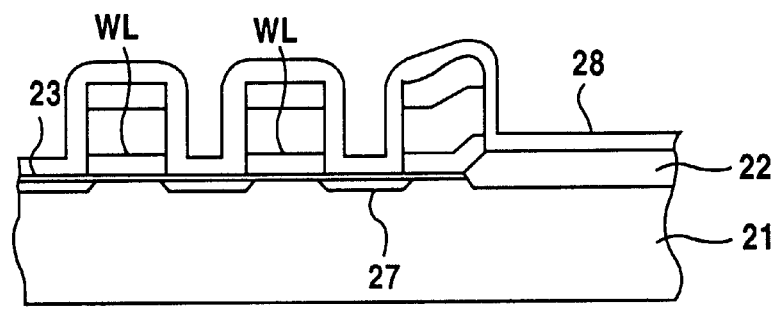
Figure 15C:
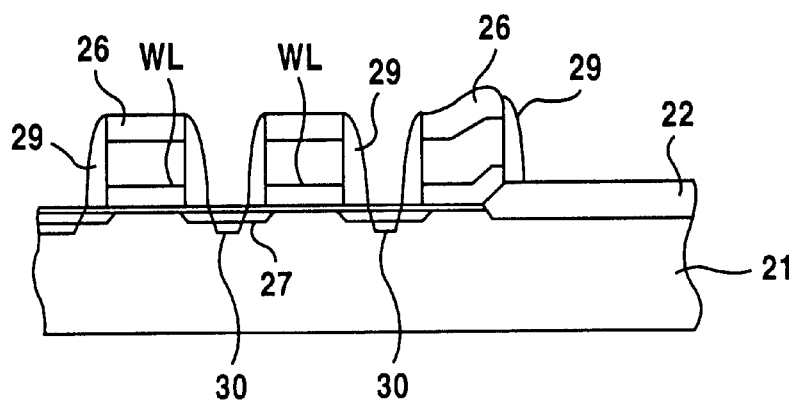

Subsequently, as shown in FIG. 15B, a first insulating layer 28 made of $SiO_2$ and used for formation of the side walls is formed as a whole to have a thickness of 1000 Å. Further, as shown in FIG. 15C, the first insulating layer 28 is remained as the side walls 29 on the side surfaces of the word lines WL by vertically etching the first insulating layer 28 in terms of the RIE.

After this, the impurity is introduced into both sides of the gate electrode WL in the device forming regions A while using the side walls 29, the first cap layer 26, etc. as a mask and then activated so as to form a deep impurity diffusion layer 30 of high impurity concentration. The source layer and the drain layer in the LDD structure of the MOS transistor are constructed by the deep impurity diffusion layer 30 and the above shallow impurity diffusion layer 27.

Figure 15D:
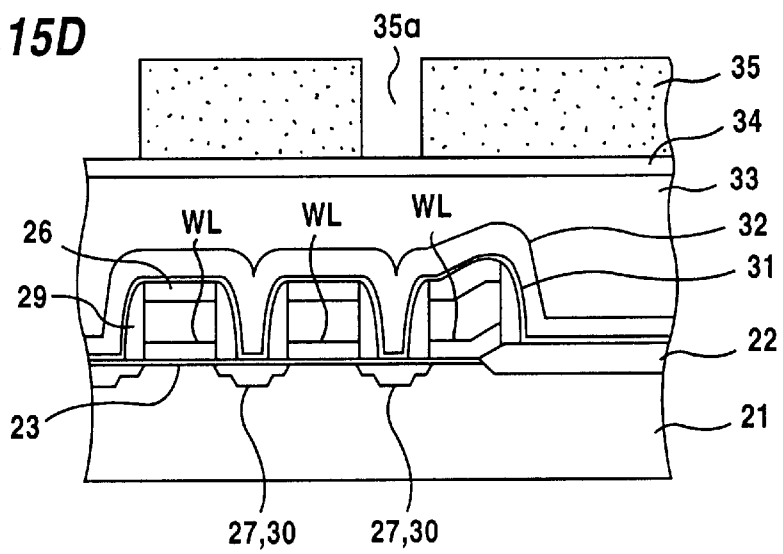

Next, as shown in FIG. 15D, a first protection film 31 made of $SiO_2$ and covering the gate oxide film 23, the side walls 29, the first cap layers 26, and so on is formed by CVD to have a thickness of 200 Å. Then, a first covering layer 32 made of $Si_3N_4$, a first interlayer insulating layer 33 made of BPSG, and a first intermediate layer 34 made of $SiO_2$ are grown in sequence on the first protection film 31 to have a thickness of 1000 Å, 2000 Å, and 200 Å respectively, and then a photoresist 35 is coated on the first intermediate layer 34. A film thickness of the first covering layer 32 is set to sufficiently bury the word lines WL.

Thereafter, windows 35a are formed by exposing and developing the photoresist 35. The windows 35a in the photoresist 35 are formed to be positioned over high concentration impurity diffusion layers 30 to which the capacitor is electrically connected, as described later.

Figure 15E:
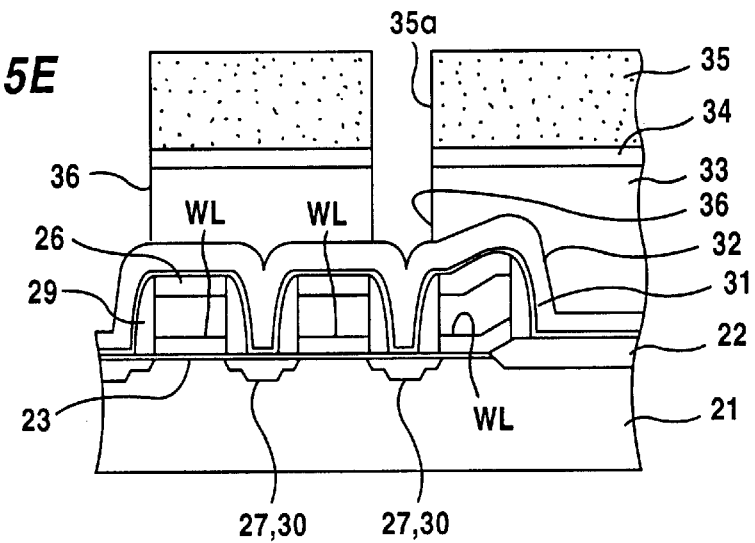

Then, as shown in FIG. 15E, the first intermediate layer 34 and the first interlayer insulating layer 33 beneath the windows 35a are etched by RIE sequentially to form upper portions of storage contact holes 36.

Figure 15F:
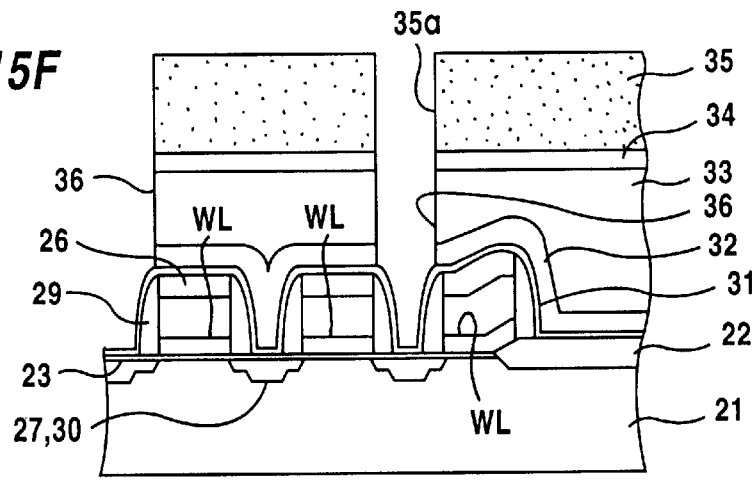

Thereafter, as shown in FIG. 15F, the first covering layer 32 made of $Si_3N_4$ and exposed at the bottom of the windows 35a is etched under the above conditions to form lower portions of the storage contact holes 36. In the etching conditions, as shown in FIG. 5, the pressure is set to more than 250 mTorr and the etching selectivity exceeds more than 10. The power supplied to the electrode 3 of the RIE equipment 1 is set to 400 W and, for example, the flow rate of the $CH_2F_2$ gas is set to less than ⅓ of the flow rate of the Ar gas.

According to such conditions, since the etching rate of the first blanket layer 32 is high and anisotropic etching in the vertical direction can be achieved, the side etching hardly occurs in the first blanket layer 32 but the first protection film 32 still remains. Accordingly, since there is no possibility that the lateral recesses occur in the first covering film 32 on the first cap layers 26, the storage contact holes 36 are never connected. In addition, selectivity and anisotropy of the etching can be sufficiently assured, the first covering layer 32 on the side surfaces of the side walls 29 can be completely removed by excessively etching the first covering layer 32 and therefore the storage contact holes 36 can be prevented from being narrowed on the side surfaces of the side walls 39. In this case, the word lines WL are never exposed from the side walls 29 and the first cap layers 26.

In turn, under the condition shown in FIG. 16C, the first protection film 32 made of $SiO_2$ and the gate insulating layer 23 are removed by the dilution hydrogen fluoride via the storage contact holes 36. Consequently, the high concentration impurity diffusion layers 30 can be exposed from the storage contact holes 36.

Figure 15G:
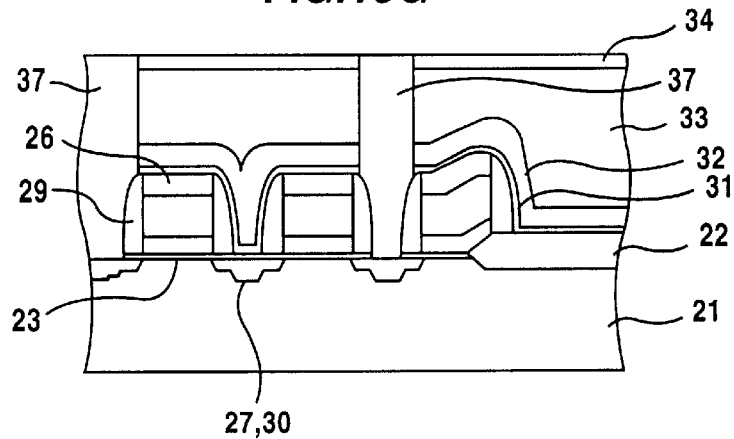

As shown in FIG. 15G, a polysilicon including impurity is then formed by CVD to be buried in the storage contact holes 36 after the photoresist 35 is removed, so that storage contact layers 37 made of polysilicon are formed. Since the polysilicon is also grown on the first intermediate layer 34, such polysilicon formed on areas other than the storage contact layers 37 is removed by etching.

Figure 15H:
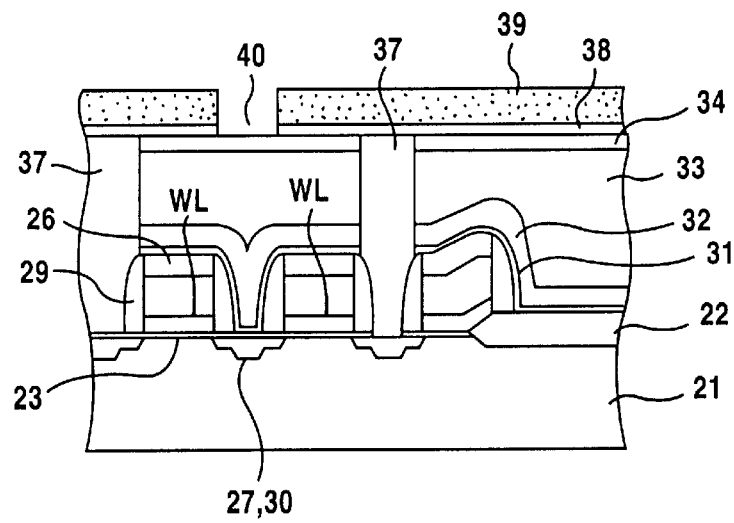

After this, an underlying layer 38 of 200 Å thickness is formed on the first intermediate layer 34 and the storage contact layers 37. In addition, as shown in FIG. 15H, the underlying layer 38 is patterned using a resist mask 39 to form openings 40 over the high concentration impurity diffusion layers 30 to which bit lines described later are electrically connected.

Figure 15I:
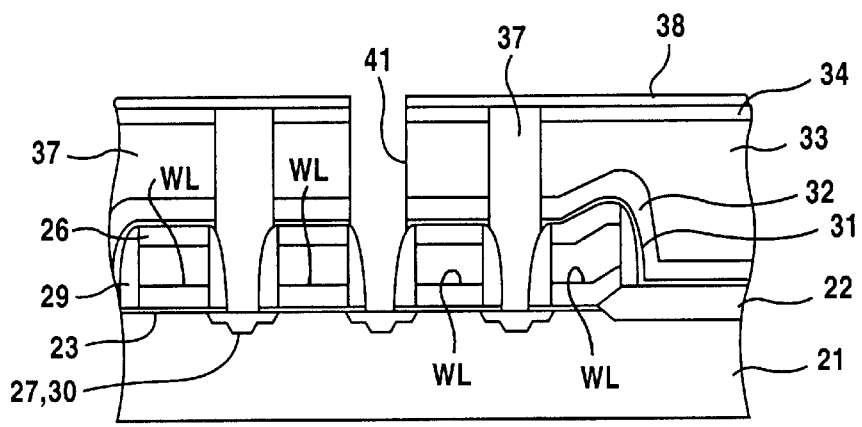
Figure 15J:
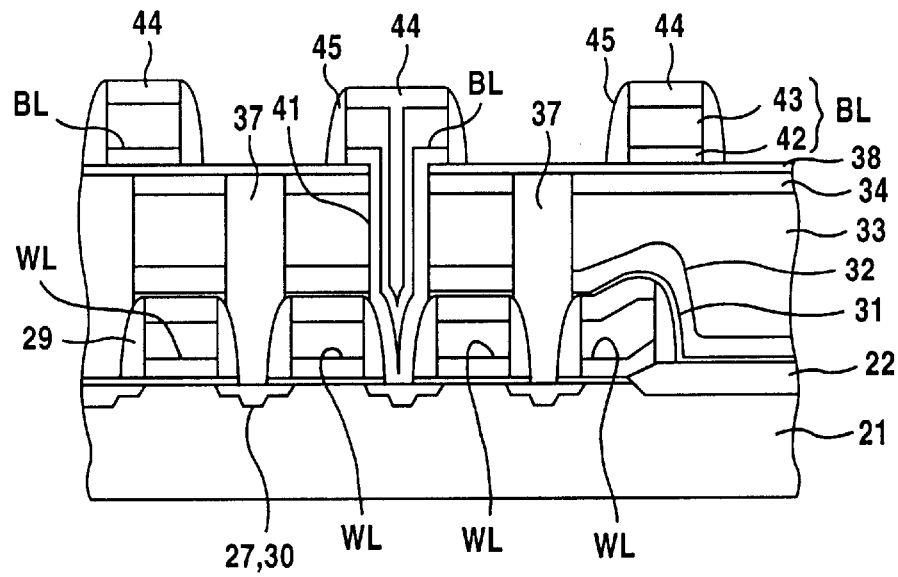

Then, as shown in FIG. 15I, the first intermediate layer 34 and the interlayer insulating layer 33 positioned below the openings 40 are etched by RIE using the resist mask 39 to upper portions of bit line contact holes 41.

Then, the first covering layer 32, the first protection film 31, and the gate insulating layer 23 positioned below the openings 40 are etched by RIE to form lower portions of the bit line contact holes 41. The etching conditions are set to the same as in the case where the lower portions of the storage contact holes 36 are formed. As a consequence, such a condition can be achieved that side etching of the first covering layer 32 on the side surfaces of the bit line contact holes 41 scarcely occurs, and the first covering layer 32 do not remain on the side surfaces of the side walls 29, and also the word lines WL are not exposed from the side walls 29 and the first cap layers 26.

Figure 18A:
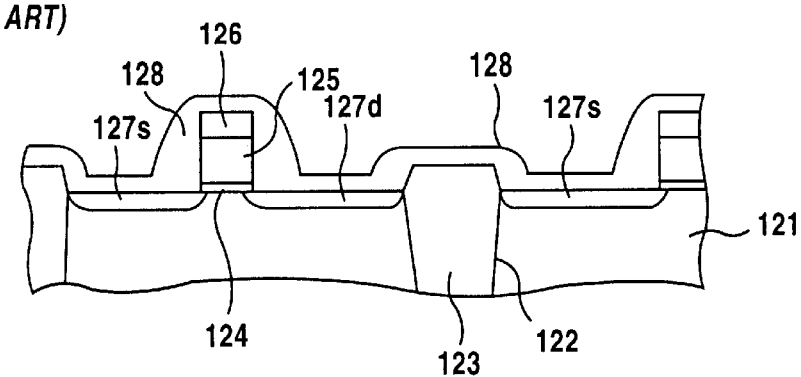
FIGS. 18A to 18E are sectional views showing steps of forming contact holes in the silicon nitride film according to the BLC technique in the prior art.
Figure 18B:
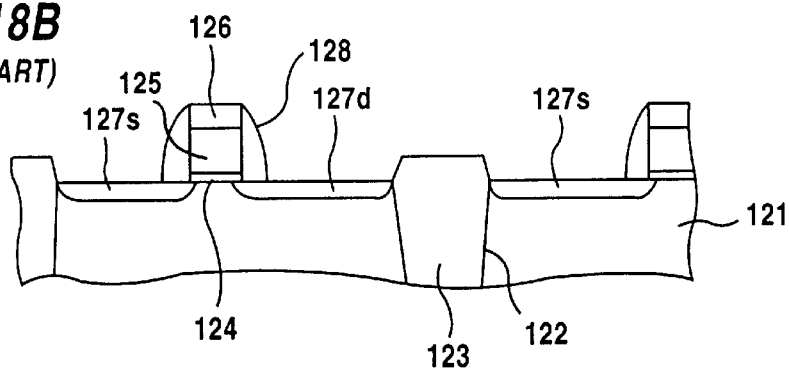
Figure 18C:
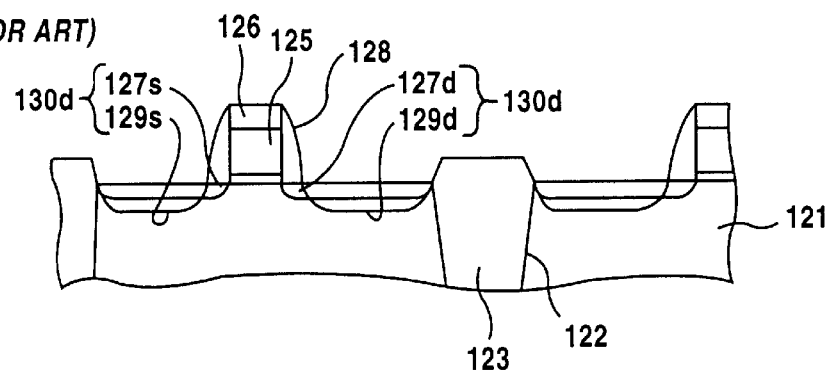
Figure 18D:
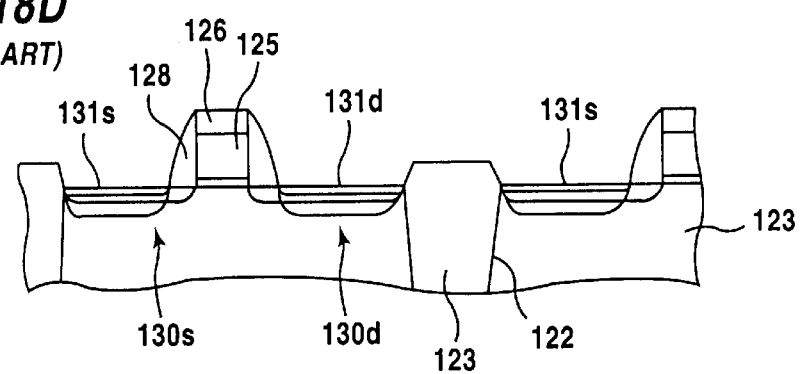
Figure 18E:
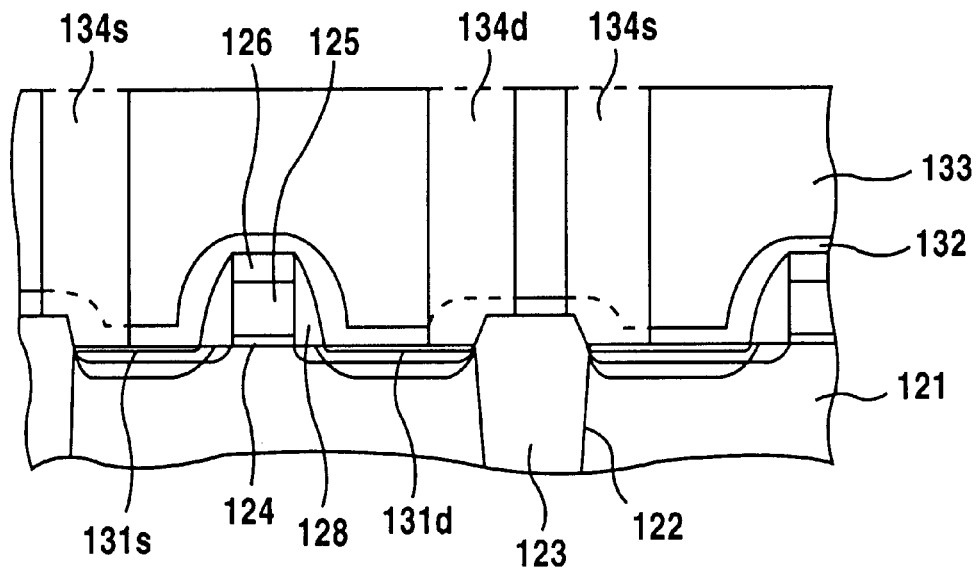
Figure 19:
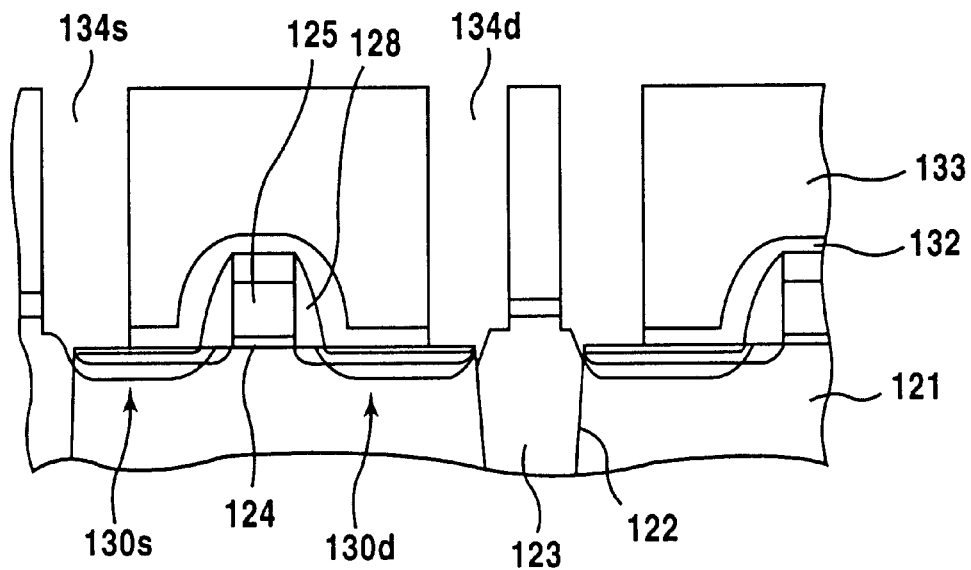
FIG. 19 is a sectional view showing etching of an oxide film in a device isolation region when the contact holes are formed in the silicon nitride film according to the BLC technique in the prior art.
Figure 20:
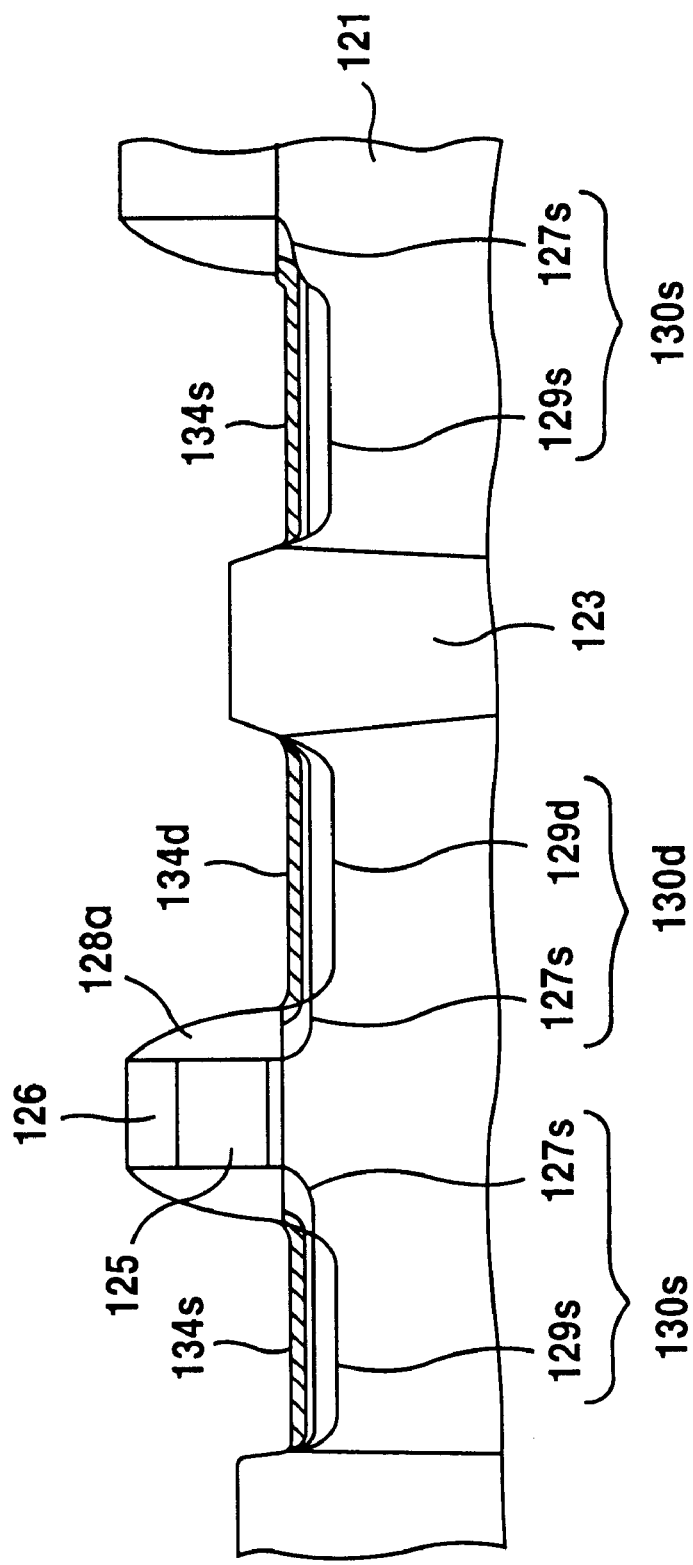
FIG. 20 is a sectional view showing impurity diffusion layers which are thinned by the etching to form side walls in the prior art.

After this, as shown in FIG. 18A, bit lines BL are formed. Steps of forming the bit lines BL are given as follow.

A polysilicon layer 42, a silicide layer 43, and a second cap layer 44 are formed sequentially by CVD in the bit line contact holes 41 and on the underlying layer 38. These layers 42, 43, and 44 are formed under the same conditions as layer growth conditions used to form the word lines WL. In this case, since no first covering layer 32 remains on the side surfaces of the side walls 29 in the bit line contact holes 41 because of vertical anisotropic etching of the first covering layer 32, a contacting area between the polysilicon layer 42 and the high concentration impurity diffusion layer 30 can be assured as designed. Further, since the word lines WL are never exposed from the side walls 29 and the first cap layers 26, the polysilicon 42 constituting the bit line contact portion is in no way brought into contact with the word line WL.

The polysilicon layer 42, the silicide layer 43, and the second cap layer 44 are patterned to form the bit lines BL. A part of the bit line BL is connected to the high concentration impurity diffusion layer 30 via the bit line contact holes 41. Then, insulating side walls 45 are formed on the side surface of the bit line BL in the same manner as the side walls 29 on the side surfaces of the word lines WL are formed.

Figure 15K:
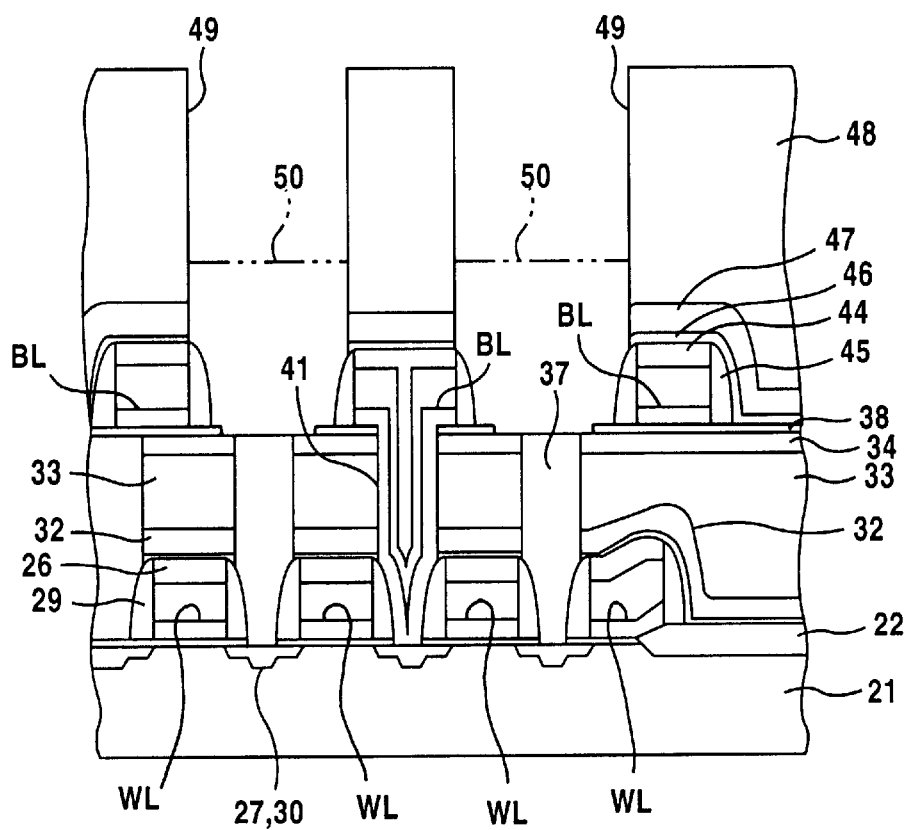

Then, as shown in FIG. 15K, a second protection film 46 made of $SiO_2$, a second covering layer 47 made of $Si_3N_4$, and a second interlayer insulating layer 48 made of BPSG are formed in sequence by CVD.

Next, the second protection film 46, the second covering layer 47, and the second interlayer insulating layer 48 are patterned to form capacitor forming openings 49 on the storage contact layer 37. Capacitors each being made up of storage electrode, a dielectric film, and an opposing electrode are formed in the capacitor forming openings 49 respectively.

As constituent material for the side walls 29, 45, $Si_3N_4$ in place of $SiO_2$ may be employed together with the above process. However, is such case, it is preferable that the gate insulating layer 26 therebetween should be formed of $Si_3N_4$. It has been confirmed according to the experiment that a low frequency below 13.56 MHZ may be similarly used as a frequency of the power supply applied to the substrate if RIE is used, but there can be brought about an effect of improving selective etching of the silicon nitride film at 400 kHz.

The RIE equipment has been employed in the above explanation, but the almost similar effect can be obtained by ECR plasma etching.

Moreover, as the gas to be added to the fluorine gas, other inert gas such as helium or other gas may be employed in addition to argon.

Etching of the silicon nitride film in LOCOS and SAL has been explained in the above example. In addition to this, the above etching process may be applied to the case where the side walls made of $Si_3N_4$ are formed or the silicon nitride mask which is used to form recesses in the silicon substrate is formed.

THIRD EXAMPLE

Next, a step of selectively etching the silicon nitride in forming the contact holes by the BLC technique will be explained.

First, steps of forming up to a structure shown in FIG. 16A will be explained.

A groove 52 is formed in the device isolation region of the silicon substrate 51, and then a buried insulating film 53 made of silicon oxide is filled into the groove 52. As a method of filling the buried insulating film 53 into the groove 52, such a method can be employed, for example, that the buried insulating film 53 is formed by CVD in the groove 52 and on the silicon substrate 51 and then the buried insulating film 53 on a surface of the silicon substrate 51 is removed by polishing.

A gate insulating film 54, a gate electrode 55, and a gate covering insulating film 56 are then formed in an active region. Then, low-impurity concentration regions 57s, 57d are formed by ion-implanting the impurity into the silicon substrate 51 on both sides of the gate electrode 55 at a low dosage by use of the gate electrode 55 as a mask. The impurity is phosphorous (P), for example, and has an opposite conductivity to the impurity included in the silicon substrate 51.

Then, an insulating film 58 made of silicon nitride or silicon nitride oxide is formed on the silicon substrate 51, the gate covering insulating film 56, and the low-impurity concentration regions 57s, 57d to have a thickness of 50 nm.

Thereafter, the silicon substrate 51 is loaded in the chamber 2 of the RIE equipment 1 shown in FIG. 1. Then, as shown in FIG. 16B, the insulating film 58 is etched in the substantially vertical direction by RIE such that the insulating film 58 remains on side surfaces of the gate electrode 55 and the gate covering insulating film 56. Such insulating film 128 remaining on the side surfaces of the gate electrodes 125 are used as the side walls.

During reactive ion etching, as mentioned above, the fluorine compound gas consisting of any one of $CH_2F_2$, $CH_3F$, and $CHF_3$ and the inert gas such as Ar, He, etc. are introduced into the chamber 2. The flow rate of the fluorine compound gas is set to 5 to 50 sccm, and the flow rate of the inert gas is set more than three times the flow rate of the fluorine compound gas. The pressure in the chamber 2 is set to 10 to 500 mTorr, the substrate heating temperature is set in the range of 20 to 95° C., and the supply power of the radio frequency power supply RF is set in the range of 350 to 700 W.

Under these conditions, the etching selectivity of the silicon nitride to the silicon oxide can be enhanced. Therefore, since the buried insulating film 53 made of silicon oxide is difficult to be etched in the etching step to form the side wall 58s, the silicon substrate 51 is hard to exposed from the side surfaces of the groove 52. In addition, since the surface of the silicon substrate 51 is difficult to be etched, the low-impurity concentration regions 57s, 57d can be suppressed from being thinned.

Then, as shown in FIG. 16C, using the side walls 58 and the gate covering insulating film 56 as a mask, impurity such as arsenic (As) is ion-implanted at a high dosage into the active region which is not covered with the gate electrode 55 and the side walls 58. Therefore, high-impurity concentration regions 59s, 59d are formed in the active region.

The LDD structure impurity diffusion layers 60s, 60d can be formed on both sides of the gate electrode 55 by the high-impurity concentration regions 59s, 59d and the low-impurity concentration regions 57s, 57d.

Figure 16D:
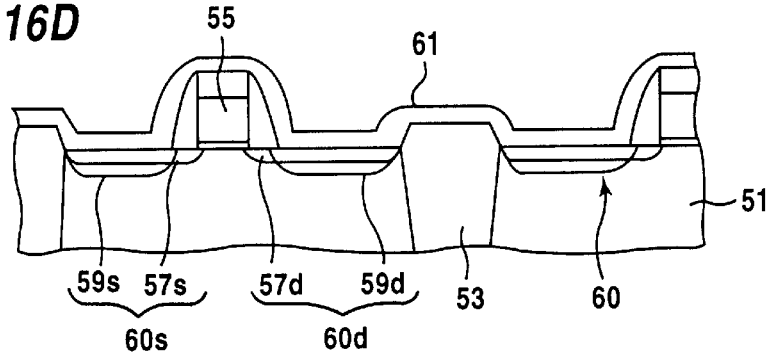

Then, as shown in FIG. 16D, a metal film 61 made of cobalt (Co) is formed by sputtering to cover the side wall 58s and the silicon substrate 51.

Figure 16E:
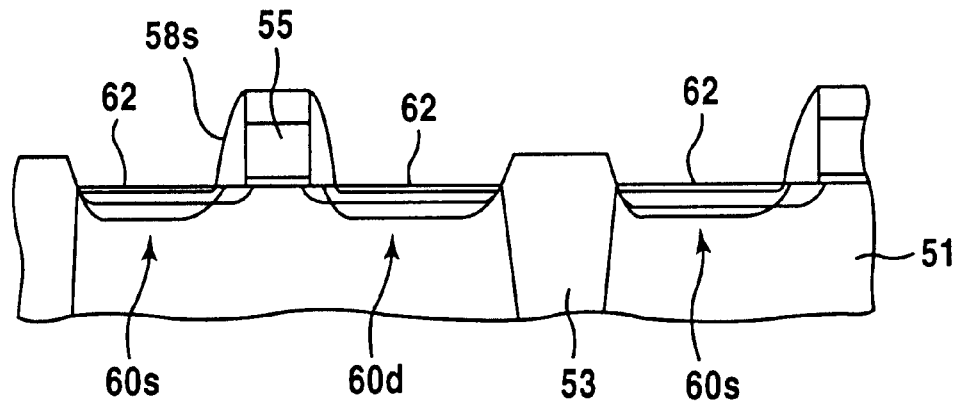

Then, by heating the metal film 61 and the low-impurity concentration regions 57s, 57d at a temperature of 550° C., silicon and metal as constituent material can be alloyed. As a result, the silicide layers 62s, 62d are formed on surfaces of the low-impurity concentration regions 57s, 57d by the salicide technique. Then, as shown in FIG. 16E, the metal film 61 which does not react yet and remains on the silicon substrate 51 is removed.

Figure 16F:
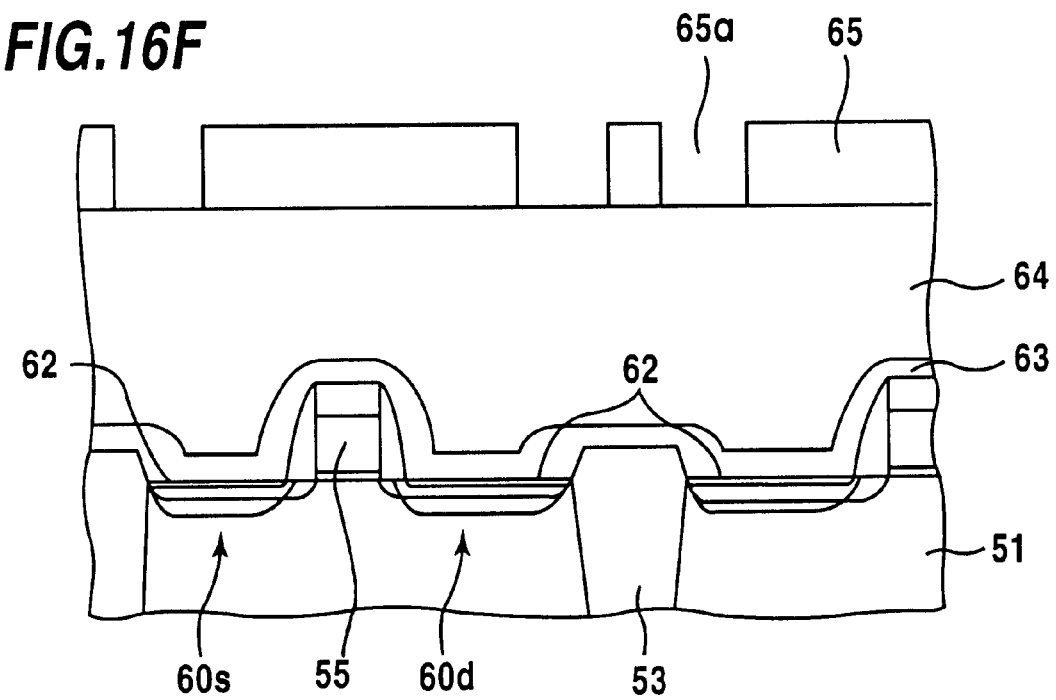

After this, as shown in FIG. 16F, the silicon nitride film 63 is formed in the active region and the device isolation region, and then an interlayer insulating film 64 such as PSG, BSG, or $SiO_2$ including the silicon oxide is formed on the silicon nitride film 63. Then, the interlayer insulating film 64 is planarized by chemical-mechanical polishing, then a photoresist 65 is coated on the interlayer insulating film 64, and then windows 65a are formed over the high-impurity concentration regions 59s, 59d in the photoresist 65 by selectivity exposing and developing the photoresist 65.

Figure 16G:
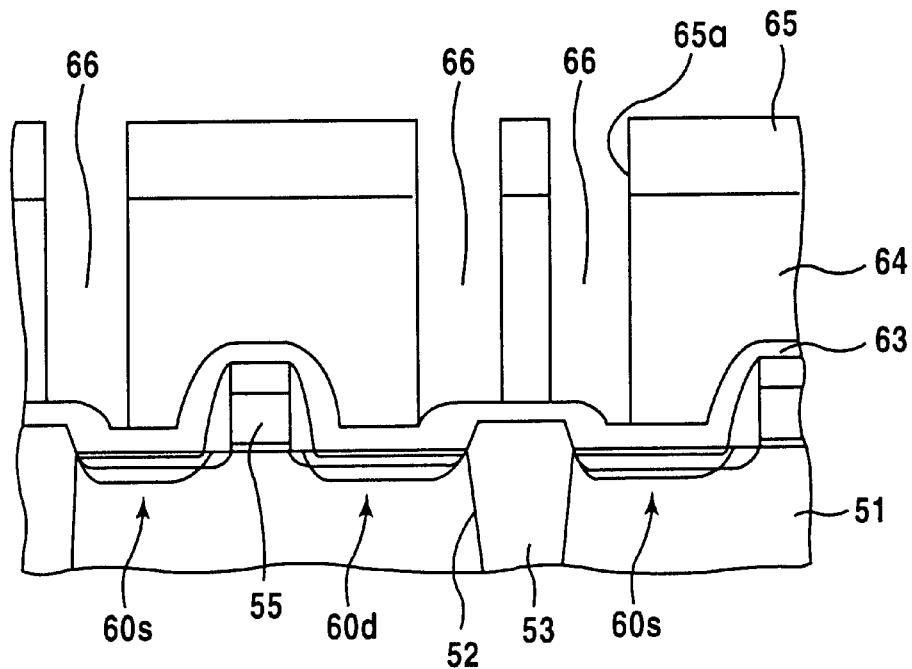
Figure 16H:
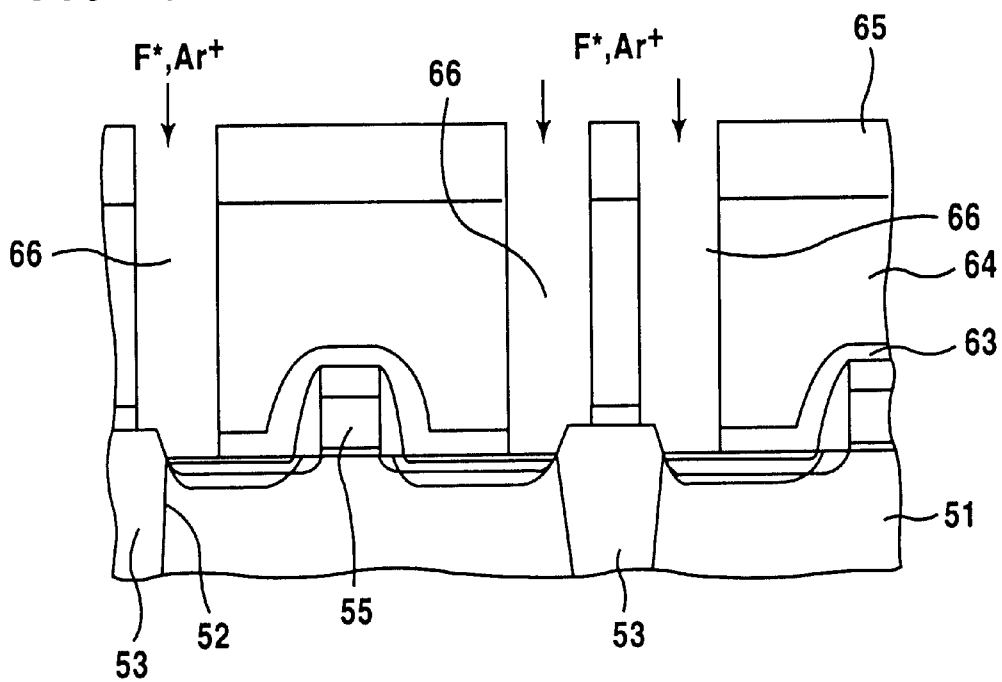

Then, the silicon substrate 51 is loaded in the chamber 2 of the RIE equipment 1 shown in FIG. 1. Then, as shown in FIG. 16G, the interlayer insulating film 64 is etched using the photoresist 65 as a mask. Then, as shown in FIG. 16H, contact holes 66 are formed by etching the silicon nitride film 63.

The etching of the interlayer insulating film 64 can be etched by the gas including $C_4F_8$, CO, Ar, for example. According to such etching gas, the etching selectivity of the interlayer insulating film 64 to the silicon nitride film 63 can be made high so that the silicon nitride film 63 can remain.

As described above, during the etching of the silicon nitride film 63, the fluorine compound gas consisting of any one of $CH_2F_2$, $CH_3F$, and $CHF_3$ and the inert gas such as Ar, He, etc. are introduced into the chamber 2. The flow rate of the fluorine compound gas is set to 5 to 50 sccm, and the flow rate of the inert gas is set more than three times the flow rate of the fluorine compound gas. The pressure in the chamber 2 is set to 10 to 500 mTorr, the substrate heating temperature is set in the range of 20 to 95° C., and the supply power of the radio frequency power supply RF is set in the range of 350 to 700 W.

Under these conditions, the etching rate of the silicon nitride film 63 can be enhanced and also etching of the silicon oxide film 53 and the silicon substrate 51 can be suppressed. As a consequence, the silicon substrate 51 can be prevented from being exposed from the groove 52.

Figure 16I:
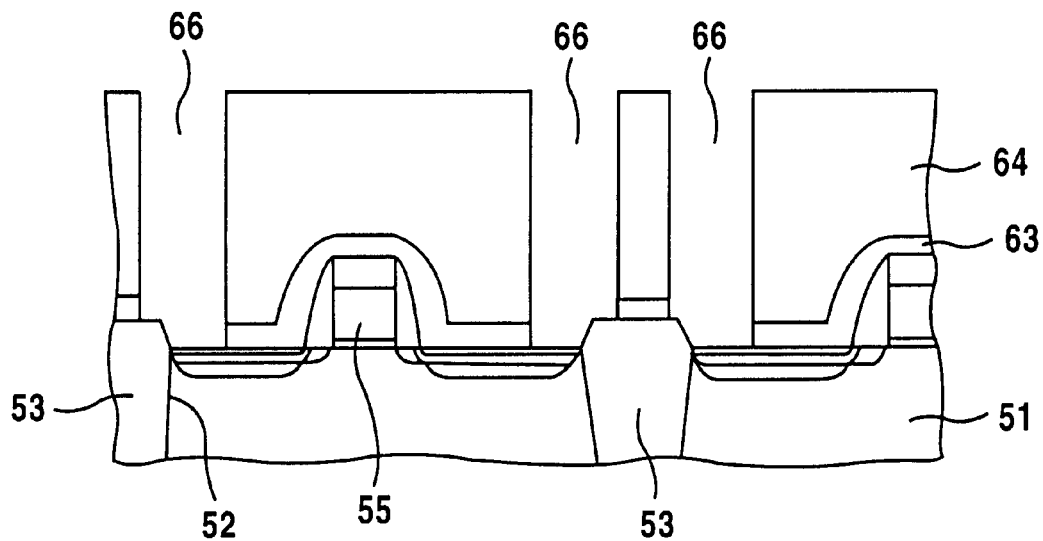
Figure 16J:
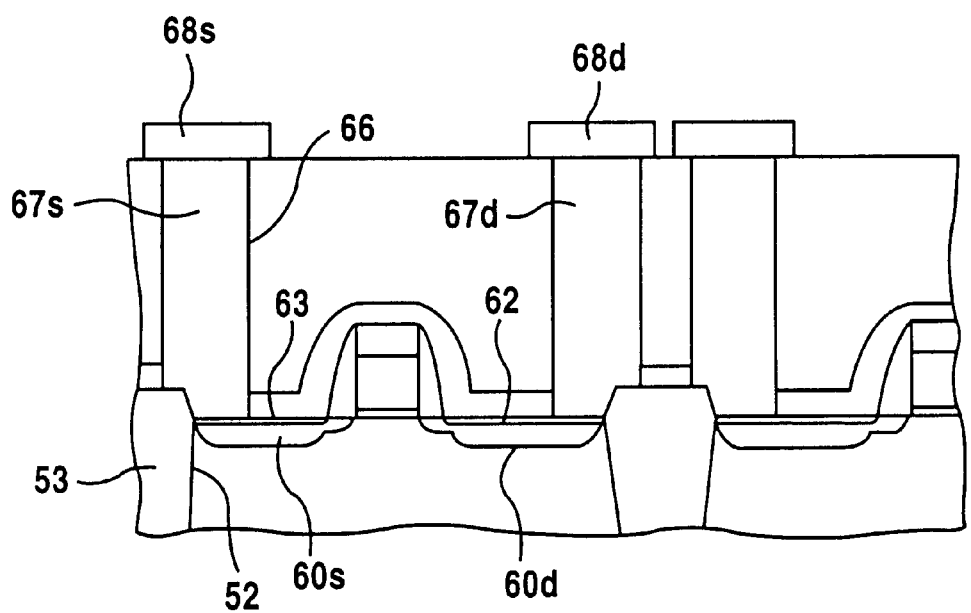
Figure 17A:
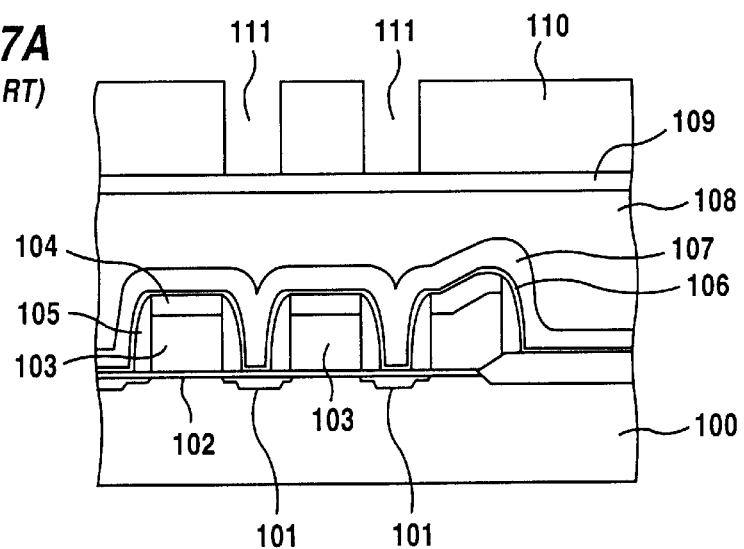
FIGS. 17A to 17C are sectional views showing steps of forming contact holes in the silicon nitride film according to the SAC technique in the prior art.
Figure 17B:
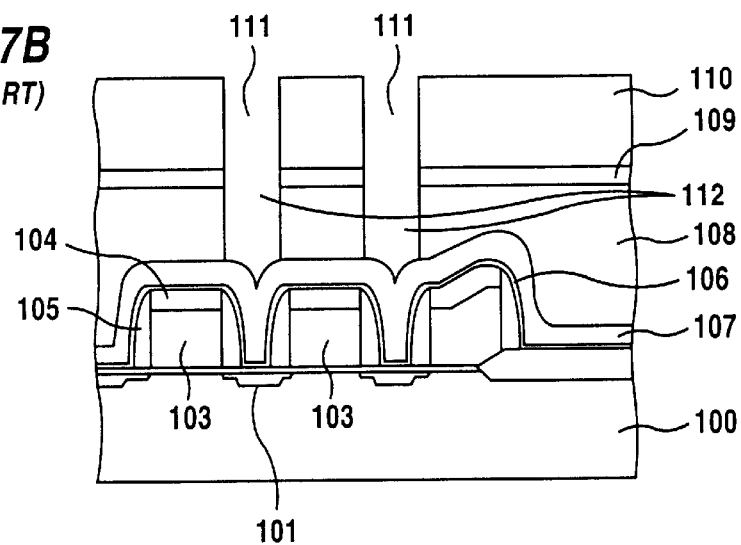
Figure 17C:
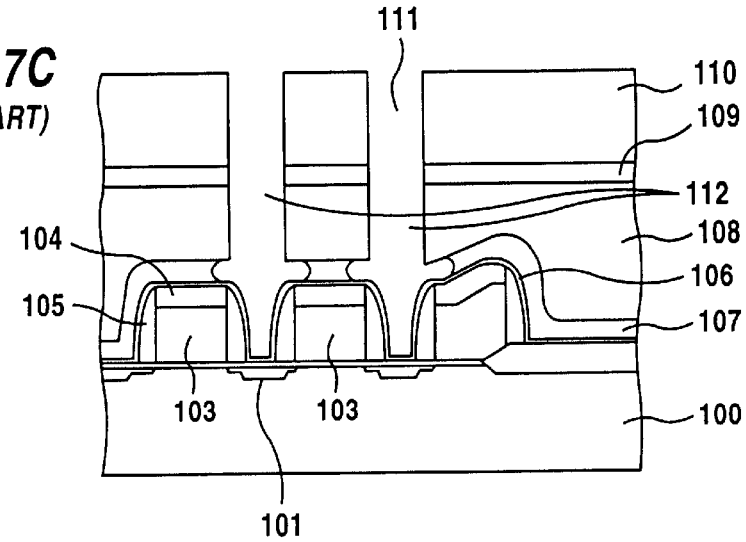

Thereafter, as shown in FIG. 16I, the photoresist 65 is removed by the solvent, then as shown in FIG. 16J, conductive films 67s, 67d are filled in the contact hole 66, and then wirings 68s, 68d are formed on the interlayer insulating film 64. In this case, the wirings 68s, 68d are electrically connected to the LDD structure impurity diffusion layers 60s, 60d. The conductive films 67s, 67d in the contact hole 66 are not connected substantially to the silicon substrate 51 beneath the impurity diffusion layers 60s, 60d, but connected only to the silicide layers 62s, 62d. As a result, leakage current flowing from the wirings 68s, 68d to the silicon substrate 51 can be suppressed.

According to the present invention described above, since the silicon nitride layer is dry-etched while using the fluorine gas composed of any one of $CH_2F_2$, $CH_3$, and $CHF_3$ and the inert gas, the etching rate of the silicon nitride layer can be enhanced 10 times or more the etching rate of the silicon oxide layer or the silicon layer beneath the silicon nitride layer and in addition the anisotropic etching thereof can be achieved.

Accordingly, because such etching process is employed in the SAC step for the semiconductor device, the silicon nitride layer can be excessively etched not to remain the silicon nitride on the side surfaces of the side walls of the gate electrodes and furthermore the silicon oxide layer covering the gate electrodes is never removed by etching. As a result, the contact region formed between two side walls can be prevented from being narrowed and also short-circuit between the gate electrodes and conductive layers in the contact holes can be prevented.

Various advantages not referred to herein will occur to one skilled in the art in employing of the invention in practice. Many variations of such embodiments exist and such variations are intended to be within the scope of the present invention and the appended claims.

What is claimed is:

1. A method of etching a silicon nitride layer comprising the steps of:

forming a silicon nitride layer on a silicon layer or a silicon oxide layer above a substrate;

loading the silicon layer or the silicon oxide layer and the silicon nitride layer in a dry etching atmosphere; and selectivity etching the silicon nitride layer with respect to the silicon layer or the silicon oxide layer by flowing a fluorine compound gas consisting of any one of $CH_2F_2$, $CH_3F$, and $CHF_3$ and an inert gas to the dry etching atmosphere, wherein a flow rate of the fluorine compound gas is set to 5 to 50 sccm, a flow rate of the inert gas is set more than three times a flow rate of the fluorine compound gas, a pressure of the dry etching atmosphere is set to 10 to 500 mTorr, and a RF power applied to the silicon nitride layer is set to 1.1 to 5.5 $W/cm^2$, and a temperature of said substrate is set 20° C. to 95° C. so as to enhance an etching selectivity of the silicon nitride layer with respect to the silicon layer or the silicon oxide layer.

2. A method of etching a silicon nitride layer according to claim 1, wherein the etching selectivity of silicon nitride with respect to the silicon layer or silicon oxide layer is set to be greater than 10.

3. A method of etching a silicon nitride layer according to claim 1, wherein the inert gas consists of an argon gas and a helium gas.

4. A method of etching a silicon nitride layer according to claim 1, wherein the dry etching is reactive ion etching.

5. A method of etching a silicon nitride layer according to claim 1, wherein an etching rate of the silicon nitride layer is set more than 200 nm/min.

6. A method of etching a silicon nitride layer according to claim 1, wherein two electrodes are arranged in the dry etching atmosphere, and an RF power of 13.56 Hz or less is applied between the two electrodes, and a distance between the two electrodes is set to 5 to 70 mm.

7. A method of manufacturing a semiconductor device comprising the steps of:

forming a plurality of gate electrodes at a distance on a semiconductor substrate separately;

forming insulating side walls on side surfaces of the gate electrodes;

forming a silicon nitride layer to cover the insulating side walls, the gate electrodes, and the semiconductor substrate;

forming an interlayer insulating layer on the silicon nitride layer;

forming contact holes vertically between the gate electrodes by patterning the interlayer insulating layer; and etching the silicon nitride layer via the contact holes in an atmosphere into which a fluorine compound gas consisting of any one of $CH_2F_2$, $CH_3F$, and $CHF_3$ and an inert gas are introduced, wherein a pressure of the atmosphere is set to 250 mTorr or more, and a flow rate of the fluorine compound gas is set to 1/5 or less of a flow rate of the inert gas, so as to enhance both an anisotropic etching in a vertical direction and an etching selectivity of the silicon nitride layer with respect to the silicon layer or the silicon oxide layer.

8. A method of manufacturing a semiconductor device comprising the steps of:

forming gate electrodes in a device forming region of a silicon substrate via an insulating layer;

forming an insulating layer made of a silicon nitride or silicon nitride oxide to cover the gate electrodes and the device forming region; and etching the insulating layer in a vertical direction in an atmosphere into which a fluorine compound gas consisting of any one of $CH_2F_2$, $CH_3F$, and $CHF_3$ and an inert gas are introduced, so as to remain the insulating layer on side surfaces of the electrodes as side walls, wherein a flow rate of the fluorine compound gas is set to 5 to 50 sccm, a flow rate of the inert gas is set more than three times a flow rate of the fluorine compound gas, a pressure of the dry etching atmosphere is set to 10 to 500 mTorr, and a RF power applied to the silicon nitride layer is set to 350 to 700 W, and a temperature of said substrate is set 20° C. to 95° C. so as to enhance an etching selectivity of the silicon nitride layer with respect to the silicon layer or the silicon oxide layer.

9. A method of manufacturing a semiconductor device comprising the steps of:

forming grooves in a semiconductor substrate to be adjacent to a device forming region of the semiconductor substrate;

filling buried insulating material made of silicon oxide in the grooves;

forming a gate electrode on the device forming region of the semiconductor substrate via a gate insulating layer;

forming impurity diffusion layers on side surfaces of the gate electrode on the semiconductor substrate;

forming a silicon nitride layer to cover the impurity diffusion layer, the buried insulating material, and the gate electrode; and etching partially the silicon nitride layer in an atmosphere into which a fluorine compound gas consisting of any one of $CH_2F_2$, $CH_3F$, and $CHF_3$ and an inert gas are introduced, so as to form a contact hole in a region spreading from the groove to the impurity diffusion layer, wherein a flow rate of the fluorine compound gas is set to 5 to 50 sccm, a flow rate of the inert gas is set more than three times a flow rate of the fluorine compound gas, a pressure of the dry etching atmosphere is set to 10 to 500 mTorr, and a RF power applied to the silicon nitride layer is set to 350 to 700 W, and a temperature of said substrate is set 20° C. to 95° C. so as to enhance an etching selectivity of the silicon nitride layer with respect to the silicon layer or the silicon oxide layer.

10. A method of etching a silicon nitride layer comprising the steps of:

forming a silicon nitride layer on a silicon layer or a silicon oxide layer above a substrate;

loading the silicon layer or the silicon oxide layer and the silicon nitride layer in a dry etching atmosphere; and selectivity etching the silicon nitride layer with respect to the silicon layer or the silicon oxide layer by flowing a fluorine compound gas consisting of any one of $CH_2F_2$, $CH_3F$, and $CHF_3$ and an inert gas to the dry etching atmosphere, wherein an anisotropy of the etching, an etching rate of the silicon nitride layer, and an etching selectivity of the silicon nitride layer with respect to the silicon layer or the silicon oxide layer are simultaneously enhanced by controlling a flow rate of the fluorine compound gas.

* * * * *